US009030345B2

(12) United States Patent
Kato

(10) Patent No.: US 9,030,345 B2
(45) Date of Patent: May 12, 2015

(54) RING OSCILLATOR CIRCUIT, A/D CONVERSION CIRCUIT, AND SOLID STATE IMAGING APPARATUS

(75) Inventor: Shuichi Kato, Tokyo (JP)

(73) Assignee: Olympus Corporation, Tokyo (JP)

( * ) Notice: Subject to any disclaimer, the term of this patent is extended or adjusted under 35 U.S.C. 154(b) by 488 days.

(21) Appl. No.: 13/542,997

(22) Filed: Jul. 6, 2012

(65) Prior Publication Data
US 2013/0037697 A1    Feb. 14, 2013

(30) Foreign Application Priority Data
Jul. 6, 2011   (JP) ................. 2011-150080

(51) Int. Cl.
*H03M 1/60* (2006.01)
*H03K 3/03* (2006.01)
*H03M 1/14* (2006.01)
*H03M 1/50* (2006.01)

(52) U.S. Cl.
CPC ............... *H03K 3/0315* (2013.01); *H03M 1/14* (2013.01); *H03M 1/502* (2013.01); *H03M 1/60* (2013.01)

(58) Field of Classification Search
CPC ............................... H03M 1/60; H03K 3/0315
USPC .................... 341/157, 155; 331/46, 57, 60
See application file for complete search history.

(56) References Cited

U.S. PATENT DOCUMENTS

| | | | |
|---|---|---|---|
| 5,416,444 A * | 5/1995 | Yamauchi et al. | ............. 331/45 |
| 5,477,196 A | 12/1995 | Yamauchi et al. | |
| 7,710,208 B2 * | 5/2010 | Goff | ............. 331/57 |
| 7,825,696 B2 * | 11/2010 | Watanabe et al. | ............. 326/93 |
| 8,542,138 B2 * | 9/2013 | Galton et al. | ............. 341/118 |
| 8,786,474 B1 * | 7/2014 | Mann | ............. 341/120 |

FOREIGN PATENT DOCUMENTS

| | | |
|---|---|---|
| JP | 61-033013 A | 2/1986 |
| JP | 3-220814 A | 9/1991 |
| JP | 06-216721 A | 8/1994 |
| JP | 08-313567 A | 11/1996 |
| JP | 10-051276 A | 2/1998 |
| JP | 2010-148005 A | 7/2010 |

OTHER PUBLICATIONS

Office Action dated Feb. 3, 2015, issued in corresponding Japanese Patent Application No. 2011-150080, with English translation (3 pages).

* cited by examiner

*Primary Examiner* — Brian Young
(74) *Attorney, Agent, or Firm* — Westerman, Hattori, Daniels & Adrian, LLP

(57) ABSTRACT

A ring oscillator circuit causing a pulse signal to circulate around a circle to which an even number of inverting circuits are connected in a ring, wherein one of the inverting circuits is a first starting inverting circuit, which drives a first pulse signal according to a control signal, another of the inverting circuits is a second starting inverting circuit, which drives a second pulse signal based on a leading edge of the first pulse signal, still another is a third starting inverting circuit, which drives a third pulse signal based on the leading edge of the first pulse signal after the second pulse signal is driven, and the first to third starting inverting circuits are arranged within the circle of the inverting circuits in order of the third, second, and first pulse signals in traveling directions of the pulse signals.

16 Claims, 14 Drawing Sheets

FIG. 2

| STATE \ TERMINAL | CONTROL SIGNAL | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|---|
| RESET: ○ | — | H | L | H | L | H | L | H | L | H | L | H | L | H | L | H | L |
| SET: ● | — | L | H | L | H | L | H | L | H | L | H | L | H | L | H | L | H |
| 0TH-ROUND INVERSION 0 | L | ○ | ○ | ○ | ○ | ○ | ○ | ○ | ○ | ○ | ○ | ○ | ○ | ● | ● | ● | ● |
| 0TH-ROUND INVERSION 1 | H | ● | ○ | ○ | ○ | ○ | ○ | ○ | ○ | ○ | ○ | ○ | ○ | ● | ● | ● | ● |
| 0TH-ROUND INVERSION 2 | H | ● | ● | ○ | ○ | ○ | ○ | ○ | ○ | ○ | ○ | ○ | ○ | ● | ● | ● | ● |
| 0TH-ROUND INVERSION 3 | H | ● | ● | ● | ○ | ○ | ○ | ○ | ○ | ○ | ○ | ○ | ○ | ● | ● | ● | ● |
| 0TH-ROUND INVERSION 4 | H | ● | ● | ● | ● | ○ | ○ | ○ | ○ | ○ | ○ | ○ | ○ | ● | ● | ● | ● |
| 0TH-ROUND INVERSION 5 | H | ● | ● | ● | ● | ● | ○ | ○ | ○ | ○ | ○ | ○ | ○ | ● | ● | ● | ● |
| 0TH-ROUND INVERSION 6 | H | ● | ● | ● | ● | ● | ● | ○ | ○ | ○ | ○ | ○ | ○ | ● | ● | ● | ● |
| 0TH-ROUND INVERSION 7 | H | ● | ● | ● | ● | ● | ● | ● | ○ | ○ | ○ | ○ | ○ | ○ | ● | ● | ● |
| 0TH-ROUND INVERSION 8 | H | ● | ● | ● | ● | ● | ● | ● | ● | ○ | ○ | ○ | ○ | ○ | ○ | ● | ● |
| 0TH-ROUND INVERSION 9 | H | ● | ● | ● | ● | ● | ● | ● | ● | ● | ○ | ○ | ○ | ○ | ○ | ○ | ● |
| 0TH-ROUND INVERSION 10 | H | ○ | ● | ● | ● | ● | ● | ● | ● | ● | ● | ○ | ○ | ○ | ○ | ○ | ○ |
| 0TH-ROUND INVERSION 11 | H | ○ | ○ | ● | ● | ● | ● | ● | ● | ● | ● | ● | ○ | ○ | ○ | ○ | ○ |
| 0TH-ROUND INVERSION 12 | H | ○ | ○ | ○ | ● | ● | ● | ● | ● | ● | ● | ● | ● | ○ | ○ | ○ | ○ |
| 0TH-ROUND INVERSION 13 | H | ○ | ○ | ○ | ○ | ● | ● | ● | ● | ● | ● | ● | ● | ● | ○ | ○ | ○ |
| 0TH-ROUND INVERSION 14 | H | ○ | ○ | ○ | ○ | ○ | ○ | ● | ● | ● | ● | ● | ● | ● | ● | ○ | ○ |
| 0TH-ROUND INVERSION 15 | H | ○ | ○ | ○ | ○ | ○ | ○ | ○ | ● | ● | ● | ● | ● | ● | ● | ● | ○ |
| 0TH-ROUND INVERSION 16 | H | ○ | ○ | ○ | ○ | ○ | ○ | ○ | ○ | ● | ● | ● | ● | ● | ● | ● | ● |
| 1ST-ROUND INVERSION 1 | H | ● | ○ | ○ | ○ | ○ | ○ | ○ | ○ | ○ | ○ | ○ | ○ | ● | ● | ● | ● |
| 1ST-ROUND INVERSION 2 | H | ● | ● | ○ | ○ | ○ | ○ | ○ | ○ | ○ | ○ | ○ | ○ | ● | ● | ● | ● |
| 1ST-ROUND INVERSION 3 | H | ● | ● | ● | ○ | ○ | ○ | ○ | ○ | ○ | ○ | ○ | ○ | ● | ● | ● | ● |
| 1ST-ROUND INVERSION 4 | H | ● | ● | ● | ● | ○ | ○ | ○ | ○ | ○ | ○ | ○ | ○ | ● | ● | ● | ● |

| STATE \ TERMINAL | CONTROL SIGNAL | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|---|
| RESET: ○ | — | L | L | L | L | L | L | L | L | L | L | L | L | L | L | L | L |
| SET: ● | — | H | H | H | H | H | H | H | H | H | H | H | H | H | H | H | H |
| 0TH-ROUND INVERSION 0 | L | ○ | ○ | ○ | ○ | ○ | ○ | ○ | ○ | ○ | ○ | ○ | ● | ● | ● | ● | ● |
| 0TH-ROUND INVERSION 1 | H | ● | ○ | ○ | ○ | ○ | ○ | ○ | ○ | ○ | ○ | ○ | ● | ● | ● | ● | ● |
| 0TH-ROUND INVERSION 2 | H | ● | ● | ○ | ○ | ○ | ○ | ○ | ○ | ○ | ○ | ○ | ● | ● | ● | ● | ● |
| 0TH-ROUND INVERSION 3 | H | ● | ● | ● | ○ | ○ | ○ | ○ | ○ | ○ | ○ | ○ | ● | ● | ● | ● | ● |
| 0TH-ROUND INVERSION 4 | H | ● | ● | ● | ● | ○ | ○ | ○ | ○ | ○ | ○ | ○ | ● | ● | ● | ● | ● |
| 0TH-ROUND INVERSION 5 | H | ● | ● | ● | ● | ● | ○ | ○ | ○ | ○ | ○ | ○ | ● | ● | ● | ● | ● |
| 0TH-ROUND INVERSION 6 | H | ● | ● | ● | ● | ● | ● | ○ | ○ | ○ | ○ | ○ | ● | ● | ● | ● | ● |
| 0TH-ROUND INVERSION 7 | H | ● | ● | ● | ● | ● | ● | ● | ○ | ○ | ○ | ○ | ○ | ● | ● | ● | ● |
| 0TH-ROUND INVERSION 8 | H | ● | ● | ● | ● | ● | ● | ● | ● | ○ | ○ | ○ | ○ | ○ | ○ | ○ | ● |
| 0TH-ROUND INVERSION 9 | H | ● | ● | ● | ● | ● | ● | ● | ● | ● | ○ | ○ | ○ | ○ | ○ | ○ | ○ |
| 0TH-ROUND INVERSION 10 | H | ○ | ● | ● | ● | ● | ● | ● | ● | ● | ● | ○ | ○ | ○ | ○ | ○ | ○ |
| 0TH-ROUND INVERSION 11 | H | ○ | ○ | ● | ● | ● | ● | ● | ● | ● | ● | ● | ○ | ○ | ○ | ○ | ○ |
| 0TH-ROUND INVERSION 12 | H | ○ | ○ | ○ | ● | ● | ● | ● | ● | ● | ● | ● | ● | ○ | ○ | ○ | ○ |
| 0TH-ROUND INVERSION 13 | H | ○ | ○ | ○ | ○ | ● | ● | ● | ● | ● | ● | ● | ● | ● | ○ | ○ | ○ |
| 0TH-ROUND INVERSION 14 | H | ○ | ○ | ○ | ○ | ○ | ● | ● | ● | ● | ● | ● | ● | ● | ● | ○ | ○ |
| 0TH-ROUND INVERSION 15 | H | ○ | ○ | ○ | ○ | ○ | ○ | ● | ● | ● | ● | ● | ● | ● | ● | ● | ○ |
| 0TH-ROUND INVERSION 16 | H | ○ | ○ | ○ | ○ | ○ | ○ | ○ | ● | ● | ● | ● | ● | ● | ● | ● | ● |
| 1ST-ROUND INVERSION 1 | H | ● | ○ | ○ | ○ | ○ | ○ | ○ | ○ | ○ | ○ | ○ | ● | ● | ● | ● | ● |
| 1ST-ROUND INVERSION 2 | H | ● | ● | ○ | ○ | ○ | ○ | ○ | ○ | ○ | ○ | ○ | ● | ● | ● | ● | ● |
| 1ST-ROUND INVERSION 3 | H | ● | ● | ● | ○ | ○ | ○ | ○ | ○ | ○ | ○ | ○ | ● | ● | ● | ● | ● |
| 1ST-ROUND INVERSION 4 | H | ● | ● | ● | ● | ○ | ○ | ○ | ○ | ○ | ○ | ○ | ● | ● | ● | ● | ● |

FIG. 13

| STATE \ TERMINAL | CONTROL SIGNAL | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|---|
| RESET: ○ | — | H | L | H | L | H | L | H | L | H | L | H | L | H | L | H | L |
| SET: ● | — | L | H | L | H | L | H | L | H | L | H | L | H | L | H | L | H |
| 0TH-ROUND INVERSION 0 | L | ○ | ○ | ○ | ○ | ○ | ○ | ○ | ○ | ○ | ○ | ○ | ● | ● | ● | ● | ● |
| 0TH-ROUND INVERSION 1 | H | ● | ○ | ○ | ○ | ○ | ○ | ○ | ○ | ○ | ○ | ○ | ● | ● | ● | ● | ● |
| 0TH-ROUND INVERSION 2 | H | ● | ● | ○ | ○ | ○ | ○ | ○ | ○ | ○ | ○ | ○ | ● | ● | ● | ● | ● |
| 0TH-ROUND INVERSION 3 | H | ● | ● | ● | ○ | ○ | ○ | ○ | ○ | ○ | ○ | ○ | ● | ● | ● | ● | ● |
| 0TH-ROUND INVERSION 4 | H | ● | ● | ● | ● | ○ | ○ | ○ | ○ | ○ | ○ | ○ | ● | ● | ● | ● | ● |
| 0TH-ROUND INVERSION 5 | H | ● | ● | ● | ● | ● | ○ | ○ | ○ | ○ | ○ | ○ | ● | ● | ● | ● | ● |
| 0TH-ROUND INVERSION 6 | H | ● | ● | ● | ● | ● | ● | ○ | ○ | ○ | ○ | ○ | ○ | ● | ● | ● | ● |
| 0TH-ROUND INVERSION 7 | H | ● | ● | ● | ● | ● | ● | ● | ○ | ○ | ○ | ○ | ○ | ○ | ● | ● | ● |
| 0TH-ROUND INVERSION 8 | H | ● | ● | ● | ● | ● | ● | ● | ● | ○ | ○ | ○ | ○ | ○ | ○ | ○ | ● |
| 0TH-ROUND INVERSION 9 | H | ● | ● | ● | ● | ● | ● | ● | ● | ● | ○ | ○ | ○ | ○ | ○ | ○ | ○ |
| 0TH-ROUND INVERSION 10 | H | ○ | ● | ● | ● | ● | ● | ● | ● | ● | ● | ○ | ○ | ○ | ○ | ○ | ○ |
| 0TH-ROUND INVERSION 11 | H | ○ | ○ | ● | ● | ● | ● | ● | ● | ● | ● | ● | ○ | ○ | ○ | ○ | ○ |
| 0TH-ROUND INVERSION 12 | H | ○ | ○ | ○ | ● | ● | ● | ● | ● | ● | ● | ● | ● | ○ | ○ | ○ | ○ |
| 0TH-ROUND INVERSION 13 | H | ○ | ○ | ○ | ○ | ● | ● | ● | ● | ● | ● | ● | ● | ● | ○ | ○ | ○ |
| 0TH-ROUND INVERSION 14 | H | ○ | ○ | ○ | ○ | ○ | ● | ● | ● | ● | ● | ● | ● | ● | ● | ○ | ○ |
| 0TH-ROUND INVERSION 15 | H | ○ | ○ | ○ | ○ | ○ | ○ | ● | ● | ● | ● | ● | ● | ● | ● | ● | ○ |
| 0TH-ROUND INVERSION 16 | H | ○ | ○ | ○ | ○ | ○ | ○ | ○ | ● | ● | ● | ● | ● | ● | ● | ● | ● |
| 1ST-ROUND INVERSION 1 | H | ● | ○ | ○ | ○ | ○ | ○ | ○ | ○ | ● | ● | ● | ● | ● | ● | ● | ● |
| 1ST-ROUND INVERSION 2 | H | ● | ● | ○ | ○ | ○ | ○ | ○ | ○ | ○ | ● | ● | ● | ● | ● | ● | ● |
| 1ST-ROUND INVERSION 3 | H | ● | ● | ● | ○ | ○ | ○ | ○ | ○ | ○ | ○ | ● | ● | ● | ● | ● | ● |
| 1ST-ROUND INVERSION 4 | H | ● | ● | ● | ● | ○ | ○ | ○ | ○ | ○ | ○ | ○ | ● | ● | ● | ● | ● |

FIG. 14

| STATE \ TERMINAL | CONTROL | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|---|
| RESET: ○ | — | H | L | H | L | H | L | H | L | H | L | H | L | H | L | H | L |
| SET: ● | — | L | H | L | H | L | H | L | H | L | H | L | H | L | H | L | H |
| 0TH-ROUND INVERSION 0 | L | ○ | ○ | ○ | ○ | ○ | ○ | ○ | ○ | ○ | ○ | ● | ● | ● | ● | ● | ● |
| ⋮ | | | | | | | | | | | | | | | | | |
| 0TH-ROUND INVERSION 5 | H | ● | ● | ● | ● | ● | ○ | ○ | ○ | ○ | ○ | ○ | ● | ● | ● | ● | ● |
| ⋮ | | | | | | | | | | | | | | | | | |
| 1ST-ROUND INVERSION 3 | H | ● | ● | ● | ○ | ○ | ○ | ○ | ○ | ○ | ○ | ● | ● | ● | ● | ● | ● |
| 1ST-ROUND INVERSION 4 | H | ● | ● | ● | ● | ○ | ○ | ○ | ○ | ○ | ○ | ● | ● | ● | ● | ● | ● |

FIG. 15

| STATE \ TERMINAL | CONTROL | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|---|
| RESET: ○ | — | H | L | H | L | H | L | H | L | H | L | H | L | H | L | H | L |
| SET: ● | — | L | H | L | H | L | H | L | H | L | H | L | H | L | H | L | H |
| 0TH-ROUND INVERSION 0 | L | ○ | ○ | ○ | ○ | ○ | ○ | ○ | ○ | ○ | ○ | ● | ● | ● | ● | ● | ● |
| ⋮ | | | | | | | | | | | | | | | | | |
| 1ST-ROUND INVERSION 4 | H | ● | ● | ● | ● | ○ | ○ | ○ | ○ | ○ | ○ | ● | ● | ● | ● | ● | ● |
| ⋮ | | | | | | | | | | | | | | | | | |
| 2ND-ROUND INVERSION 4 | H | ● | ● | ● | ● | ○ | ○ | ○ | ○ | ○ | ● | ● | ● | ● | ● | ● | ● |
| ⋮ | | | | | | | | | | | | | | | | | |
| 3RD-ROUND INVERSION 4 | H | ● | ● | ● | ● | ○ | ○ | ○ | ○ | ● | ● | ● | ● | ● | ● | ● | ● |
| 7TH-ROUND INVERSION 4 | H | ● | ● | ● | ● | ● | ● | ● | ● | ● | ● | ● | ● | ● | ● | ● | ● |

RING OSCILLATOR CIRCUIT, A/D CONVERSION CIRCUIT, AND SOLID STATE IMAGING APPARATUS

BACKGROUND OF INVENTION

1. Field of Invention

The present invention relates to a ring oscillator circuit, an analog-to-digital (AD) conversion circuit, and a solid-state imaging apparatus.

Priority is claimed on Japanese Patent Application No. 2011-150080, filed on Jul. 6, 2011, the content of which is incorporated herein by reference.

2. Description of Related Art

In the related art, methods using a ring oscillator circuit having a configuration of an odd number of inverting circuits (stages), which are connected in a ring and each invert an input signal to output the inverted input signal, when the time is converted into a digital value, are well-known. This ring oscillator circuit functions as an oscillation circuit that causes a pulse edge to circulate around the ring. Technology for converting the time into a digital value by detecting the number of inverting circuits (stages) through which a pulse edge has passed and converting the detected number of inverting circuits (stages) into a binary number is well-known.

For example, technology disclosed in Japanese Unexamined Patent Application, First Publication No. H03-220814 is a pulse phase difference encoding circuit using a ring oscillator circuit as described above, which is referred to as an analog-to-digital (A/D) conversion circuit. Also, an integral A/D conversion circuit, a single-slope A/D conversion circuit, and the like are well-known as an A/D conversion circuit using the ring oscillator circuit for converting the time into a digital value. The A/D conversion circuit using the above-described ring oscillator circuit is applied to a solid-state imaging apparatus having a built-in A/D conversion circuit because the entire A/D conversion circuit can be implemented by a digital circuit.

In addition, for example, in Japanese Unexamined Patent Application, First Publication No. H06-216721, technology for implementing a ring oscillator circuit in which an even number of inverting circuits (stages) are connected in a ring is disclosed. In the technology disclosed in Japanese Unexamined Patent Application, First Publication No. H06-216721, the number of times a pulse edge has circulated around the ring oscillator circuit constituted by an even number of inverting circuits (stages) and the number of inverting circuits (stages) that do not satisfy one round in which the pulse edge has passed through inverting circuits within the ring oscillator circuit are detected. Conversion of the number of inverting circuits of the ring oscillator circuit through which the pulse edge has passed into a binary number is performed by designating the detected number of circulations as more significant bits, designating the detected number of inverting circuits (stages) as less significant bits, converting each number into a binary number, and connecting the more significant bits and the less significant bits.

Thereby, it is possible to simplify a complex calculation process according to the conversion into a binary number in the technology disclosed in Japanese Unexamined Patent Application, First Publication No. H06-216721.

Here, a specific example of a ring oscillator circuit disclosed in Japanese Unexamined Patent Application, First Publication No. H06-216721 will be described. FIG. 12 is a block diagram illustrating an example of a schematic configuration of the ring oscillator circuit of the related art disclosed in Japanese Unexamined Patent Application, First Publication No. H06-216721. In FIG. 12, the case in which negative AND circuits (NAND circuits) and logical NOT circuits (inverter circuits) are combined and configured as inverting circuits is illustrated as an example of a ring oscillator circuit constituted by 16 (stage) inverting circuits. More specifically, as illustrated in FIG. 12, the ring oscillator circuit 180 includes NAND circuits I1 and I12 and inverter circuits I2 to I1 and I13 to I16.

The NAND circuit I1 functions as a first starting inverting circuit that starts driving of a first pulse signal (hereinafter referred to as "main pulse") based on a control signal. The NAND circuit I12 functions as a second starting inverting circuit that starts driving of a second pulse signal (hereinafter referred to as "reset pulse") based on the main pulse. The other inverter circuits I2 to I11 and I13 to I16 function as inverting circuits that transfer the input main pulse and reset pulse to the inverting circuits of the next stages.

The NAND circuit I1 starts driving of the main pulse by inverting the input control signal. The NAND circuit I12 starts driving of the reset pulse based on the input main pulse after the main pulse is transferred and output from the inverter circuit I4. In addition, the NAND circuit I1 resets the main pulse based on the input reset pulse after the reset pulse is transferred and output from the inverter circuit I16. Thereafter, the NAND circuit I1 restarts driving of the main pulse based on the input previous main pulse after the previously driven main pulse is transferred and output from the inverter circuit I16.

As described above, in the ring oscillator circuit 180, the NAND circuit I1 drives the main pulse, the NAND circuit I12 drives the reset pulse, and the inverter circuits I2 to I11 and I13 to I16 transfer the input main pulse and reset pulse, so that an oscillation operation is performed.

Next, an operation of the ring oscillator circuit disclosed in Japanese Unexamined Patent Application, First Publication No. H06-216721 will be more specifically described. In the following description, the NAND circuit I1, the inverter circuits I2 to I11, the NAND circuit I12, and the inverter circuits I13 to I16 illustrated in FIG. 12 are referred to as the inverting circuits I1 to I16, respectively. FIG. 13 is a diagram illustrating operations of the inverting circuits within the ring oscillator circuit 180 of the related art. FIG. 13 illustrates a state of a signal (hereinafter referred to as "node") of an output terminal of each inverting circuit under the assumption that delay times required for signal inversions of the inverting circuits I1 to I16 are identical.

Numerals 1 to 16 illustrated in FIG. 13 correspond to nodes of the inverting circuit I1 to I16 illustrated in FIG. 12. In addition, "o: white circle" illustrated in FIG. 13 indicates that each node is in the reset state, and "●: black circle" indicates that each node is in a set state. The logic of the reset state and the set state of the inverting circuits I1 to I16 is denoted by "L" or "H" within FIG. 13. "L" represents that the inverting circuits I1 to I16 output a signal of a "Low" level. "H" represents that a signal of a "High" level is output. In addition, in "X"th-round inversion "Y" illustrated in FIG. 13, "X" represents that main-pulse circulation is "X"th-round, and "Y" denotes a time when one node has changed from a previous state. Thereby, in FIG. 13, node positions in which a pulse edge of the main pulse and a pulse edge of the reset pulse are positioned within the ring oscillator circuit 180 are schematically illustrated.

The transition of a basic operation of the ring oscillator circuit 180 will be described with reference to FIG. 13.

In FIG. 13, a state of 0th-round inversion 0 is a state in which the control signal has the "Low" level, the ring oscillator circuit 180 is reset, and no main pulse occurs. Thereafter, the control signal has the "High" level, so that the ring oscillator circuit 180 starts the operation. If the control signal has the "High" level, the inverting circuit I1 is switched from the reset state to the set state in 0th-round inversion 1, so that the main pulse is generated and the state of the node 1 is switched to the set state.

Thereafter, the main pulse is sequentially transferred to the inverting circuits I2 to I4 of the next stages, so that the states of the nodes 2 to 4 are sequentially switched to the set state. In 0th-round inversion 5, the inverting circuit I12 is switched from the set state to the reset state according to the state of the node 4, so that the reset pulse is generated and the state of the node 12 is switched to the reset state. The reset pulse is sequentially transferred to the inverting circuits I13 to I16 of the next stages, so that the states of the nodes 13 to 16 are sequentially switched to the reset state. Even after the 0th-round inversion 5, the transfer of the main pulse to the inverting circuit of the next stage continues, and the states of the nodes are sequentially switched to the set state.

Thereafter, in 0th-round inversion 10, the inverting circuit I1 is switched from the set state to the reset state according to the state of the node 16, so that the main pulse is reset and the state of the node 1 is switched to the reset state. The reset state of the main pulse is sequentially transferred to the inverting circuits of the next stages, so that the states of the nodes are sequentially switched to the reset state.

Thereafter, in the 0th-round inversion 16, the main pulse generated in the 0th-round inversion 1 circulates once within the ring oscillator circuit 180. In the next 1st-round inversion 1, the inverting circuit I1 is re-switched from the reset state to the set state, so that the next main pulse is generated. The next main pulse is sequentially transferred to the inverting circuits within the ring oscillator circuit 180, so that the nodes are sequentially switched to the set state.

After 1st-round inversion 4, the state of each node re-transitions to a state of 0th-round inversion 5.

Thereafter, 0th-round inversion 6 to 1st-round inversion 4 and 0th-round inversion 5 are iterated, so that the main pulse circulates around the inverting circuits I1 to I6 connected in the ring within the ring oscillator circuit 180.

As described above, the main pulse passes through the inverting circuits within the ring oscillator circuit 180. That is, the node state is switched from the reset state to the set state. In addition, the node state is switched from the set state to the reset state in advance by causing the reset pulse to pass through the inverting circuits before the main pulse. In this manner, the ring oscillator circuit 180 performs a stable oscillation operation by causing the main pulse and the reset pulse to circulate.

The time is converted into a digital value by detecting the number of inverting circuits (stages) through which an edge of the main pulse has passed and converting the detected number into a binary number.

In addition, resolution is one factor that determines the accuracy of the digital value. As described above, when the ring oscillator circuit 180 has been used for the purpose of converting the time into the digital value, a speed at which the main pulse passes through the inverting circuits within the ring oscillator circuit 180 determines the resolution of the digital value.

For example, when a predetermined constant time is converted into a digital value, it is possible to perform the conversion into a more highly accurate digital value in a ring oscillator circuit of inverting circuits of 40,000 stages through which the main pulse passes within the constant time than in a ring oscillator circuit of inverting circuits of only 40 stages through which the main pulse passes within the constant time at a low speed of the main pulse.

Here, the speed of the main pulse that passes through the inverting circuits within the ring oscillator circuit 180 will be described. FIGS. 14 and 15 are diagrams illustrating a relationship among operations of the inverting circuits and speeds of the main pulse and the reset pulse within the ring oscillator circuit 180 of the related art.

FIG. 14 illustrates an example of the states of the nodes within the ring oscillator circuit 180 when a speed of the main pulse that passes through the inverting circuits is lower than a speed of the reset pulse that passes through the inverting circuits. In addition, FIG. 15 illustrates an example of the states of the nodes within the ring oscillator circuit 180 when the speed of the main pulse that passes through the inverting circuits is higher than the speed of the reset pulse that passes through the inverting circuits. The viewpoints of view of FIGS. 14 and 15 are the same as that of FIG. 13.

The speeds of the main pulse and the reset pulse that pass through the inverting circuits within the ring oscillator circuit 180 can be adjusted, for example, by changing threshold voltages of the inverting circuits for each inverting circuit. More specifically, it is possible to set the speed of the reset pulse, which passes through the inverting circuits, to be higher than that of the main pulse by setting threshold voltages of the inverting circuits of the odd-numbered stages (the inverting circuits I1, I3, I5, I7, I9, I11, I13, and I15) within the ring oscillator circuit 180 to be high and setting threshold voltages of the inverting circuits of the even-numbered stages (the inverting circuits I2, I4, I6, I8, I10, I12, I14, and I16) to be low. That is, the speed of the main pulse can be set to be lower than that of the reset pulse. In addition, it is possible to set the speed of the reset pulse, which passes through the inverting circuits, to be lower than that of the main pulse by setting the threshold voltages of the inverting circuits of the odd-numbered stages within the ring oscillator circuit 180 to be low and setting the threshold voltages of the inverting circuits of the even-numbered stages to be high. That is, the speed of the main pulse can be set to be higher than the speed of the reset pulse.

The transition of the operation of the ring oscillator circuit 180 when the speed of the main pulse is lower than the speed of the reset pulse will be described with reference to FIG. 14. Even when the threshold voltages of the inverting circuits of the odd-numbered stages within the ring oscillator circuit 180 have been set to be high and the threshold voltages of the inverting circuits of the even-numbered stages set to be low, the main pulse and the reset pulse pass through the inverting circuits within the ring oscillator circuits 180 as in the transition of the basic operation of the ring oscillator circuit 180 illustrated in FIG. 13. At this time, when the speed of the reset pulse is higher than the speed of the main pulse, the reset pulse is quickly transferred to the inverting circuit I11 and the node 11 is switched to the reset state early in 1st-round inversion 3, for example, as illustrated in FIG. 14.

However, the inverting circuit I12 of the next stage is switched from the set state to the reset state according to the state of the node 4 by the main pulse being transferred to the inverting circuit I4 in subsequent inversion 4 of the first round. That is, after the inverting circuit I12 waits for the state of the node 4 to be switched to the set state by the main pulse in the inversion 4 of the first round, the inverting circuit I12 generates the next reset pulse by returning to 0th-round inversion 5 as the next inversion 5 of the first round.

As described above, because the inverting circuit I12 waits for the state of the node 4 to be switched in a state in which the speed of the main pulse is lower than the speed of the reset pulse, it is possible to iterate 0th-round inversion 6 to 1st-round inversion 4 and 0th-round inversion 5 as in the transition of the basic operation of the ring oscillator circuit 180 illustrated in FIG. 13. Thus, the circulation of the main pulse in the ring oscillator circuit 180 is not stopped, and a stable oscillation operation can be maintained.

The transition of the operation of the ring oscillator circuit 180 when the speed of the main pulse is higher than the speed of the reset pulse will be described with reference to FIG. 15. If the speed of the main pulse is high, it is possible to increase the number of stages of the inverting circuits through which the main pulse passes within a constant time. Thus, it is effective to improve the resolution of the digital value. Even when the threshold voltages of the inverting circuits of the odd-numbered stages within the ring oscillator circuit 180 have been set to be low and the threshold voltages of the inverting circuits of the even-numbered stages have been set to be high, the main pulse and the reset pulse pass through the inverting circuits within the ring oscillator circuit 180 as in the transition of the basic operation of the ring oscillator circuit 180 illustrated in FIG. 13. At this time, when the speed of the main pulse is higher than the speed of the reset pulse, that is, when the speed of the reset pulse is lower than the speed of the main pulse, for example, the node 11 is not switched to the reset state even in $1^{st}$-round inversion 4, and an interval between the reset pulse and the main pulse becomes narrow as illustrated in FIG. 15 as compared to the transition of the basic operation illustrated in FIG. 13.

Further, as a high-speed main pulse and a low-speed reset pulse undergo more circulations within the ring oscillator circuit 180, the interval between the reset pulse and the main pulse becomes narrower. Ultimately, the main pulse catches up with the reset pulse. In order to facilitate the understanding of this phenomenon, an example in which the interval between the reset pulse and the main pulse is narrowed by one stage every time the circulation is iterated as second and third circulations and the main pulse catches up with the reset pulse in 7th-round inversion 4 is illustrated in FIG. 15.

As described above, the main pulse catches up with the reset pulse in a state in which the speed of the main pulse is higher than the speed of the reset pulse. Accordingly, it may be impossible to maintain the same operation as in the transition of the basic operation of the ring oscillator circuit 180 illustrated in FIG. 13. In this case, the circulation of the main pulse in the ring oscillator circuit 180 is stopped, and it may be impossible to maintain a stable oscillation operation.

To avoid the circulation of the main pulse from being stopped due to this situation, an operation of setting the speed of the reset pulse to be higher than the speed of the main pulse is proposed in technology disclosed in Japanese Unexamined Patent Application, First Publication No. H06-216721.

SUMMARY OF INVENTION

According to a first aspect of the present invention, there is provided a ring oscillator circuit in which an even number of inverting circuits, each of which inverts an input signal to output the inverted input signal, are connected in a ring and a pulse signal is caused to circulate around a circle of the inverting circuits connected in the ring, wherein one inverting circuit of the inverting circuits is a first starting inverting circuit, which starts driving of a first pulse signal according to an input control signal, another inverting circuit of the inverting circuits is a second starting inverting circuit, which starts driving of a second pulse signal based on a leading edge of the first pulse signal inverted by the one inverting circuit, still another inverting circuit of the inverting circuits is a third starting inverting circuit, which starts driving of a third pulse signal based on the leading edge of the first pulse signal inverted by the one inverting circuit after the driving of the second pulse signal is started by the second starting inverting circuit, and when there are simultaneously the first pulse signal, the second pulse signal, and the third pulse signal on the circle of the inverting circuits connected in the ring, the first starting inverting circuit, the second starting inverting circuit, and the third starting inverting circuit are each arranged within the circle connected in the ring so that a positional relationship of leading edges of the first, second, and third pulse signals is formed in order of the leading edge of the third pulse signal, the leading edge of the second pulse signal, and the leading edge of the first pulse signal in traveling directions of the pulse signals on the circle of the inverting circuits of the ring if the third pulse signal is a leading pulse signal.

According to a second aspect of the present invention, in the ring oscillator circuit according to the first aspect of the present invention, the even number of inverting circuits are connected in the ring in order of the first starting inverting circuit, inverting circuits of N (N≥0) stages connected to an output terminal of the first starting inverting circuit, inverting circuits of M (M≥0) stages connected to an output terminal of the inverting circuit of the Nth stage, the third starting inverting circuit connected to an output terminal of the inverting circuit of the Mth stage, inverting circuits of P (P≥0) stages connected to an output terminal of the third starting inverting circuit, inverting circuits of Q (Q≥0) stages connected to an output terminal of the inverting circuit of the Pth stage, the second starting inverting circuit connected to an output terminal of the inverting circuit of the Qth stage, and inverting circuits of S (S≥0) stages connected to an output terminal of the second starting inverting circuit, at least an output signal of the inverting circuit of the Sth stage among the inverting circuits of the S stages and the control signal are connected to input terminals of the first starting inverting circuit, at least an output signal of the inverting circuit of the Mth stage among the inverting circuits of the M stages and an output signal of the inverting circuit of the Pth stage among the inverting circuits of the P stages are connected to input terminals of the third starting inverting circuit, at least an output signal of the inverting circuit of the Qth stage among the inverting circuits of the Q stages and an output signal of the inverting circuit of the Nth stage among the inverting circuits of the N stages are connected to input terminals of the second starting inverting circuit, the number of inverting circuits of the N and S stages is an odd number, and the number of inverting circuits of the P and the number of inverting circuits of the M and Q stages are even numbers.

According to a third aspect of the present invention, in the ring oscillator circuit according to the second aspect of the present invention, the first starting inverting circuit, the second starting inverting circuit, and the third starting inverting circuit each are negative AND (NAND) circuits or negative OR (NOR) circuits.

According to a fourth aspect of the present invention, in the ring oscillator circuit according to the third aspect of the present invention, the number of inverting circuits of the N stages is an odd number when both the first starting inverting circuit and the second starting inverting circuit are the NAND circuits or the NOR circuits, and the number of inverting circuits of the N stages is an even number when the first starting inverting circuit is the NAND circuit and the second starting inverting circuit is the NOR circuit or when the first starting inverting circuit is the NOR circuit and the second starting inverting circuit is the NAND circuit.

According to a fifth aspect of the present invention, in the ring oscillator circuit according to the third or forth aspect of the present invention, the number of inverting circuits of the N and M stages is an odd number when both the first starting inverting circuit and the third starting inverting circuit are the NAND circuits or the NOR circuits, and the number of inverting circuits of the N and M stages is an even number when the first starting inverting circuit is the NAND circuit and the third starting inverting circuit is the NOR circuit or when the first starting inverting circuit is the NOR circuit and the third starting inverting circuit is the NAND circuit.

According to a sixth aspect of the present invention, in the ring oscillator circuit according to the second or fifth aspect of the present invention, the number of inverting circuits of (N+S+2) stages is greater than the number of inverting circuits of (M+P+Q+1) stages.

According to a seventh aspect of the present invention, in the ring oscillator circuit according to the third or sixth aspect of the present invention, in an array of all the inverting circuits connected in order of the first starting inverting circuit, the inverting circuits of the N stages, the inverting circuits of the M stages, the third starting inverting circuit, the inverting circuits of the P stages, the inverting circuits of the Q stages, the second starting inverting circuit, and the inverting circuits of the S stages, an input threshold voltage of an odd-numbered inverting circuit is set to be low and an input threshold voltage of an even-numbered inverting circuit is set to be high when the first starting inverting circuit is the NAND circuit, and the input threshold voltage of the odd-numbered inverting circuit is set to be high and the input threshold voltage of the even-numbered inverting circuit is set to be low when the first starting inverting circuit is the NOR circuit.

According to an eighth aspect of the present invention, the ring oscillator circuit according to the first, sixth, or seventh aspect of the present invention further includes: a counter circuit for counting the number of circulations of the first pulse signal, which circulates around the circle of the inverting circuits connected in the ring, based on logical inversion of an output signal of one inverting circuit of the inverting circuits connected in the ring.

According to a ninth aspect of the present invention, the ring oscillator circuit according to the third, sixth, or seventh aspect of the present invention further includes: a counter circuit for detecting an edge of an output signal when the output signal of the inverting circuit of the Sth stage among the inverting circuits of the S stages is logically inverted, and counting the number of circulations of the first pulse signal, which circulates around the circle of the inverting circuits connected in the ring, based on the detected edge, wherein the counter circuit counts the number of circulations of the first pulse signal based on an edge when the output signal is logically inverted from a "Low" level to a "High" level if the first starting inverting circuit is the NAND circuit, and the counter circuit counts the number of circulations of the first pulse signal based on an edge when the output signal is logically inverted from the "High" level to the "Low" level if the first starting inverting circuit is the NOR circuit.

According to a tenth aspect of the present invention, the ring oscillator circuit according to the eighth or ninth aspect of the present invention further includes: a latch circuit for latching one or both of output signals of all or some inverting circuits connected in the ring and a signal indicating the number of circulations of the first pulse signal counted by the counter circuit.

According to an eleventh aspect of the present invention, the ring oscillator circuit according to the tenth aspect of the present invention further includes: a comparison circuit for comparing an input predetermined analog signal to a reference signal that increases or decreases along with the passage of time, and outputting a comparison signal when the reference signal satisfies a predetermined condition for the analog signal, wherein the pulse signal is caused to circulate around the circle of the inverting circuits connected in the ring by inverting a logical of the control signal based on a timing at which the reference signal is input to the comparison circuit, and the latch circuit latches the signal based on a timing at which the comparison signal is output from the comparison circuit.

According to a twelfth aspect of the present invention, the ring oscillator circuit according to the tenth aspect of the present invention further includes: a comparison circuit for comparing a predetermined standard signal to an integral signal that increases or decreases along with the passage of time according to a magnitude of an input predetermined analog signal, and outputting a comparison signal when the integral signal satisfies a predetermined condition for the standard signal, wherein the pulse signal is caused to circulate around the circle of the inverting circuits connected in the ring by inverting logic of the control signal based on a timing at which the integral signal is input to the comparison circuit, and the latch circuit latches the signal based on a timing at which the comparison signal is output from the comparison circuit.

According to a thirteenth aspect of the present invention, there is provided an A/D conversion circuit including: the ring oscillator circuit according to the eleventh aspect of the present invention; a reference signal generation circuit for generating the reference signal; and a calculation circuit for generating a digital signal corresponding to the analog signal based on the signal latched by the latch circuit.

According to a fourteenth aspect of the present invention, there is provided an A/D conversion circuit including: the ring oscillator circuit according to the twelfth aspect of the present invention; an integral signal generation circuit for generating the integral signal; a standard signal generation circuit for generating the standard signal; and a calculation circuit for generating a digital signal corresponding to the analog signal based on the signal latched by the latch circuit.

According to a fifteenth aspect of the present invention, there is provided a solid-state imaging apparatus including: an imaging section in which a plurality of pixels, each of which outputs a pixel signal corresponding to a magnitude of an incident electromagnetic wave, are arranged in a two-dimensional matrix; and the A/D conversion circuit according to the thirteenth aspect of the present invention to which the analog signal corresponding to the pixel signal is input, wherein the comparison circuit and the latch circuit are provided for every one or more columns of the pixels constituting the imaging section.

According to a sixteenth aspect of the present invention, there is provided a solid-state imaging apparatus including: an imaging section in which a plurality of pixels, each of which outputs a pixel signal corresponding to a magnitude of an incident electromagnetic wave, are arranged in a two-dimensional matrix; and the A/D conversion circuit according to the fourteenth aspect of the present invention to which the analog signal corresponding to the pixel signal is input, wherein the integral signal generation circuit, the comparison circuit, and the latch circuit are provided for every one or more columns of the pixels constituting the imaging section.

BRIEF DESCRIPTION OF THE DRAWINGS

FIG. 2 is a diagram illustrating operations of inverting circuits within the ring oscillator circuit according to the first embodiment of the present invention.

FIG. 4 is a diagram illustrating operations of inverting circuits within the ring oscillator circuit according to the second embodiment of the present invention.

FIG. 7 is a diagram illustrating an operation within the ring oscillator circuit according to the third embodiment of the present invention.

FIG. 13 is a diagram illustrating operations of inverting circuits within the ring oscillator circuit of the related art.

FIG. 14 is a diagram illustrating a relationship among operations of the inverting circuits and speeds of a main pulse and a reset pulse within the ring oscillator circuit of the related art.

FIG. 15 is a diagram illustrating a relationship among operations of the inverting circuits and speeds of a main pulse and a reset pulse within the ring oscillator circuit of the related art.

DETAILED DESCRIPTION OF INVENTION

First Embodiment

Figure 1:
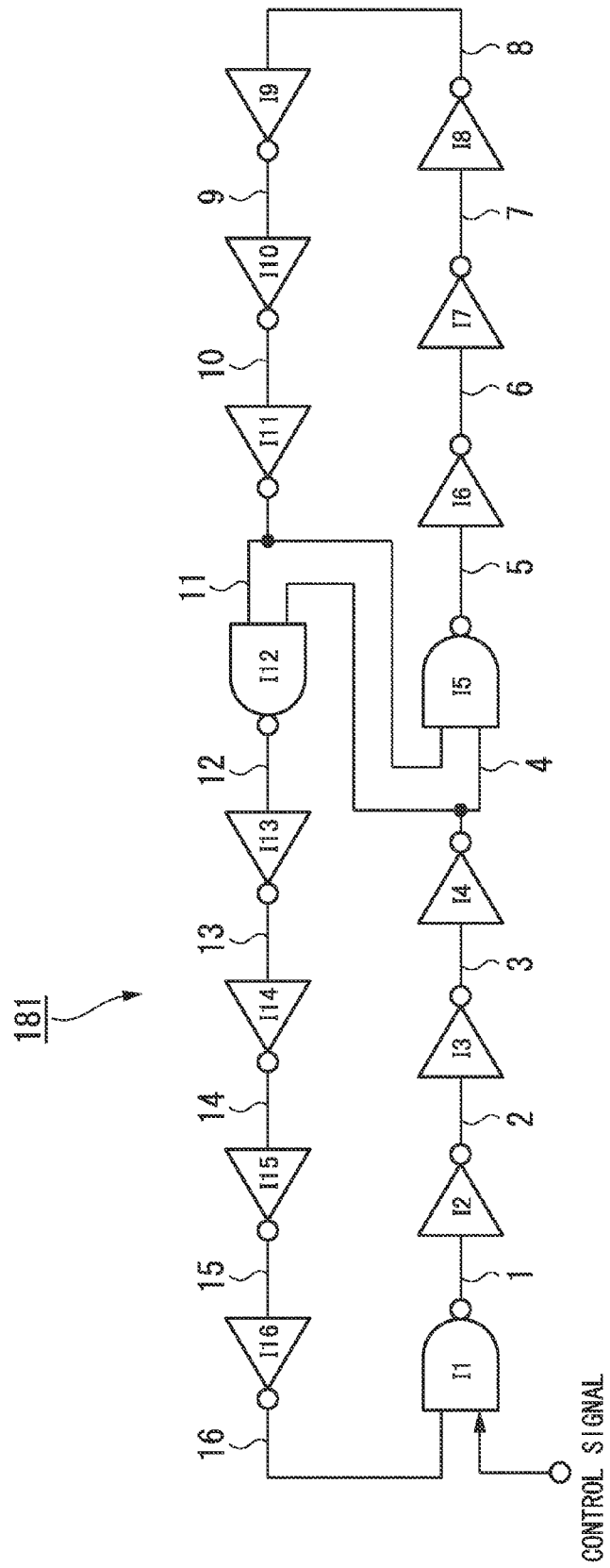
FIG. 1 is a block diagram illustrating a configuration of a ring oscillator circuit according to a first embodiment of the present invention.
Figure 12:
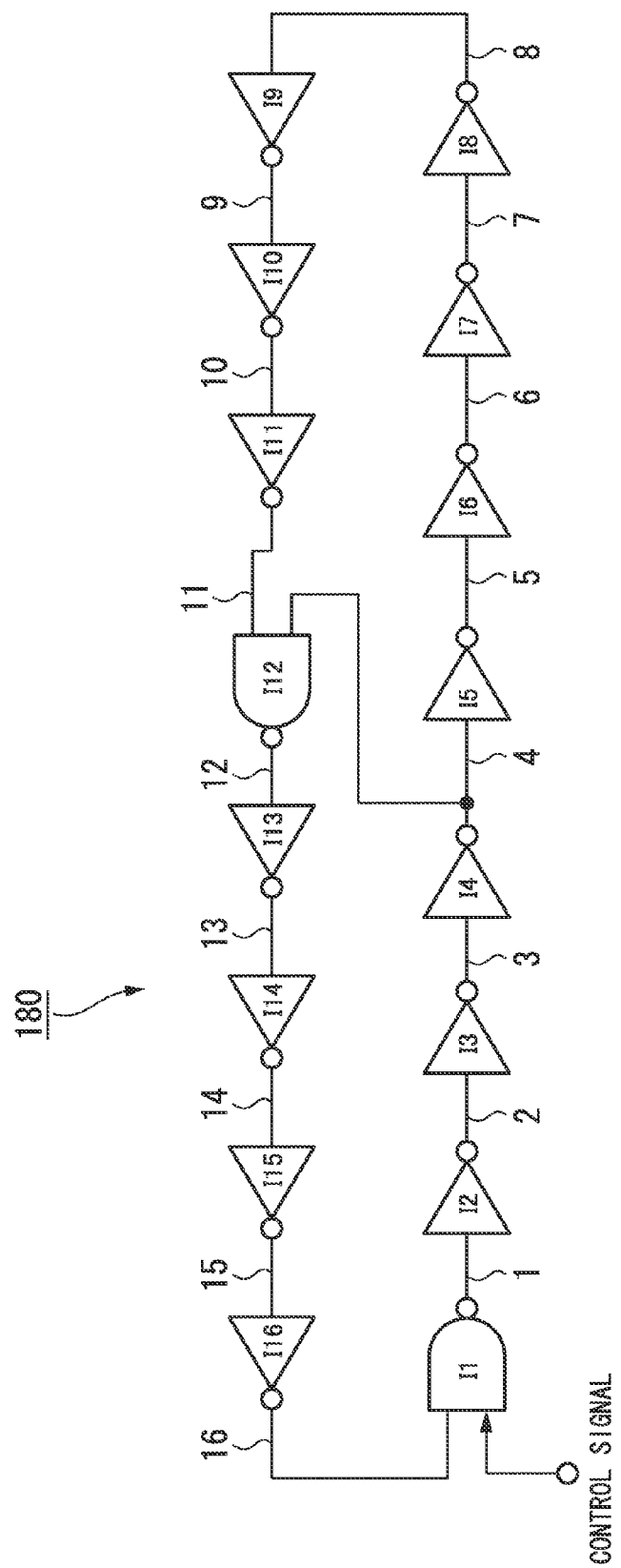
FIG. 12 is a block diagram illustrating an example of a schematic configuration of a ring oscillator circuit of the related art.

Hereinafter, embodiments of the present invention will be described with reference to the drawings. FIG. 1 is a block diagram illustrating a configuration of a ring oscillator circuit according to the first embodiment of the present invention. FIG. 1 illustrates the case in which negative AND circuits (NAND circuits) and logical NOT circuits (inverter circuits) are combined and configured as inverting circuits in a ring oscillator circuit constituted by 16 (stage) inverting circuits like the ring oscillator circuit 180 of the related art illustrated in FIG. 12. In FIG. 1, the ring oscillator circuit 181 includes a NAND circuit I1, inverter circuits I2 to I4 of three stages (an odd number of stages), a NAND circuit I5, inverter circuits I6 to I11 of six stages (an even number of stages), a NAND circuit I12, and inverter circuits I13 to I16 of four stages (an even number of stages).

The NAND circuit I1 functions as a first starting inverting circuit that starts driving of a main pulse (first pulse signal) based on a control signal. The NAND circuit I12 functions as a second starting inverting circuit that starts driving of a reset pulse (second pulse signal) based on the main pulse. The NAND circuit I5 functions as a third starting inverting circuit that starts driving of a second reset pulse (third pulse signal) based on the main pulse after the reset pulse is driven. The other inverter circuits I2 to I4, I6 to I11, and I13 to I16 function as inverting circuits that transfer the input main pulse, reset pulse, and second reset pulse to the inverting circuits of the next stages.

The NAND circuit I1 starts driving of the main pulse by inverting the input control signal. The NAND circuit I12 starts driving of the reset pulse based on the input main pulse after the main pulse is transferred and output from the inverter circuit I4. The NAND circuit I5 starts driving of the second reset pulse based on the input main pulse after the reset pulse is driven by the NAND circuit I12 and the main pulse is transferred and output from the inverter circuit I11.

In addition, the NAND circuit I1 resets the main pulse based on the input reset pulse after the reset pulse is transferred and output from the inverter circuit I16. In addition, before the reset of the main pulse, the second reset pulse resets the main pulse of an inverting circuit of a stage after the NAND circuit I5. Thereafter, the NAND circuit I1 restarts driving of the main pulse based on the input previous main pulse after the previously driven main pulse is transferred and output from the inverter circuit I16.

In the ring oscillator circuit 181, the NAND circuit I1 drives the main pulse, the NAND circuit I12 drives the reset pulse, and the NAND circuit I5 drives the second reset pulse. The inverter circuits I2 to I4, I6 to I11, and I13 to I16 transfer the pulses. As described above, three pulses of the main pulse, the reset pulse, and the second reset pulse simultaneously circulate in the ring oscillator circuit 181, so that an oscillation operation is performed.

Next, the operation of the ring oscillator circuit 181 of this embodiment will be more specifically described. In the following description, the NAND circuit I1, the inverter circuits I2 to I4, the NAND circuit I5, the inverter circuits I6 to I11, the NAND circuit I12, and the inverter circuits I13 to I16 illustrated in FIG. 1 are also referred to as inverting circuits I1 to I16, respectively.

FIG. 2 is a diagram illustrating operations of inverting circuits within the ring oscillator circuit 181 of this embodiment. FIG. 2 illustrates states of nodes (signals of output terminals of inverting circuits) under the assumption that delay times required for signal inversions of the inverting circuits I1 to I16 are identical.

The viewpoint of FIG. 2 is the same as the transition of the operation of the ring oscillator circuit 180 illustrated in FIG. 13. More specifically, numerals 1 to 16 illustrated in FIG. 2 correspond to nodes of the inverting circuit I1 to I16 illustrated in FIG. 1. In addition, "o: white circle" illustrated in FIG. 2 indicates that each node is in the reset state, and "●: black circle" indicates that each node is in a set state. The logic of the reset state and the set state of the inverting circuits I1 to I16 is denoted by "L" or "H" within FIG. 2. "L" represents that the inverting circuits I1 to I16 output a signal of a "Low" level. "H" represents that a signal of a "High" level is output. In addition, in "X"th-round inversion "Y" illustrated in FIG. 2, "X" represents that main-pulse circulation is "X"th, and "Y" denotes a time when one node has changed from a previous state. Thereby, in FIG. 2, node positions in which a pulse edge of the main pulse, a pulse edge of the reset pulse, and a pulse edge of the second reset pulse are positioned within the ring oscillator circuit 181 are schematically illustrated.

The transition of the basic operation of the ring oscillator circuit 181 will be described with reference to FIG. 2. In FIG. 2, a state of 0th-round inversion 0 is a state in which the control signal has the "Low" level, the ring oscillator circuit 181 is reset, and no main pulse occurs. Thereafter, the control signal has the "High" level, so that the ring oscillator circuit 181 starts the operation. If the control signal has the "High" level, the inverting circuit I1 is switched from the reset state to the set state in 0th-round inversion 1, so that the main pulse is generated and the state of the node 1 is switched to the set state.

Thereafter, the main pulse is sequentially transferred to the inverting circuits I2 to I4 of the next stages, so that the states of the nodes 2 to 4 are sequentially switched to the set state. In 0th-round inversion 5, the inverting circuit I12 is switched from the set state to the reset state according to the state of the node 4, so that the reset pulse is generated and the state of the node 12 is switched to the reset state. The reset pulse is sequentially transferred to the inverting circuits I13 to I16 of the next stages, so that the states of the nodes 13 to 16 are sequentially switched to the reset state. Even after the 0th-round inversion 5, the transfer of the main pulse to the inverting circuit of the next stage continues, and the states of the nodes are sequentially switched to the set state.

Thereafter, in 0th-round inversion 10, the inverting circuit I1 is switched from the set state to the reset state according to the state of the node 16, so that the main pulse is reset and the state of the node 1 is switched to the reset state. The reset state of the main pulse is sequentially transferred to the inverting circuits of the next stages, so that the states of the nodes are sequentially switched to the reset state.

Thereafter, in 0th-round inversion 12, the inverting circuit I5 is switched from the set state to the reset state according to the state of the node 11, so that the second reset pulse is generated and the state of the node 5 is switched to the reset state. The second reset pulse is sequentially transferred to the inverting circuits of the next stages, so that the states of the nodes are sequentially switched to the reset state. Even after 0th-round inversion 12, the transfer of the main pulse to the inverting circuit of the next stage continues and the states of the nodes are sequentially switched to the set state.

0th-round inversion 12 is when the node 12 is switched to the set state by the continuation of the transfer of the main pulse to the inverting circuit I12, and the state of the node 3 is switched to the reset state by the transfer of the reset state of the main pulse to the inverting circuit 13. Further, in 0th-round inversion 12, the second reset pulse switches the state of the node 5 to the reset state before switching to the reset state of the main pulse. That is, 0th-round inversion 12 is when there are simultaneously three pulse edges including the pulse edge of the main pulse, the pulse edge of the reset pulse, and the pulse edge of the second reset pulse.

At this time, a positional relationship of the three pulse edges within the ring oscillator circuit 181 is formed in the order of second reset pulse→reset pulse→main pulse if the second reset pulse is set to the head in a circulation direction of the pulse within the ring oscillator circuit 181. As described above, before switching of each inverting circuit to the reset state due to the reset pulse, the second reset pulse causes the reset state to precede the set state by switching each inverting circuit to the reset state.

Thereafter, in 0th-round inversion 16, the main pulse generated in 0th-round inversion 1 circulates once within the ring oscillator circuit 181. In the next 1st-round inversion 1, the inverting circuit I1 is re-switched from the reset state to the set state, so that the next main pulse is generated. The next main pulse is sequentially transferred to each inverting circuit within the ring oscillator circuit 181, so that each node is sequentially switched to the set state.

After 1st-round inversion 4, the state of each node re-transitions to a state of 0th-round inversion 5.

Thereafter, 0th-round inversion 6 to 1st-round inversion 4 and 0th-round inversion 5 are iterated, so that the main pulse continuously circulates around the inverting circuits I1 to I16 connected in the ring within the ring oscillator circuit 181.

Here, when the switching of the main pulse from the set state to the reset state is focused, the inverting circuit I11 is switched to the reset state early in 1st-round inversion 2 in the ring oscillator circuit 181 as illustrated in FIG. 2. This is because the second reset pulse switches the inverting circuit to the reset state after 0th-round inversion 12 before 1st-round inversion 4 in which switching of the inverting circuit I11 to the reset state is performed based on the reset pulse. Thereby, after waiting for the state of the node 4 to be switched to the set state by the main pulse in 1st-round inversion 3 and 1st-round inversion 4 in the ring oscillator circuit 181, the next reset pulse is generated by returning to 0th-round inversion 5 as the next inversion 5 of the first round.

As described above, the main pulse passes through the inverting circuits within the ring oscillator circuit 181 (the state of the node is switched from the reset state to the set state). In addition, the reset pulse and the second reset pulse pass through the inverting circuits before the main pulse, so that the state of the node is switched from the set state to the reset state in advance. In this manner, the ring oscillator circuit 181 performs a stable oscillation operation by causing the main pulse, the reset pulse, and the second reset pulse to circulate. The time is converted into a digital value by detecting the number of inverting circuits (stages) through which an edge of the main pulse has passed and converting the detected number into a binary number.

The ring oscillator circuit 181 may include a counter circuit that counts the number of circulations of the main pulse circulating around the inside of the ring oscillator circuit 181 as a configuration for converting the time into a digital value. The counter circuit detects that the main pulse has circulated once within the ring oscillator circuit 181 by detecting a change in the state of the node 16 according to the switching of the inverting circuit I16 from the reset state to the set state, and counts the detected number of times. The number of circulations counted by the counter circuit becomes a digital value.

Further, the ring oscillator circuit 181 may include a latch circuit that latches the stats of the nodes 1 to 16 within the ring oscillator circuit 181, that is, logical values of the inverting circuits I1 to I16 as a configuration for converting the time into a digital value. The latch circuit determines a position of a node in which the pulse edge of the main pulse is circulating around the inside of the ring oscillator circuit 181 from the states of the nodes 1 to 16, and detects the number of stages of the inverting circuits through which the main pulse has passed. The number of stages of inverting circuits through which the main pulse has passed detected by the latch circuit becomes a digital value.

Further, the ring oscillator circuit 181 may include a comparison circuit that compares an analog signal to a predetermined condition as a configuration for converting a predetermined constant time into a digital value in the ring oscillator circuit 181 that performs an oscillation operation according to a predetermined analog signal. This comparison circuit outputs a comparison signal according to the comparison result. When the analog signal has been input to the comparison circuit, it is possible to output a digital value corresponding to the analog signal by starting the operation of the ring oscillator circuit 181 according to a control signal and converting the time into the digital value at a timing at which the comparison signal has been output. For example, at the timing at which the comparison signal has been output, the latch circuit can output the digital value corresponding to the analog signal by detecting the number of stages of inverting circuits through which the main pulse has passed.

As a method in which the comparison circuit compares the analog signal to the predetermined condition and outputs the comparison signal, for example, there is a method of generating a reference signal that increases or decreases at a constant slope along with the passage of time and outputting a comparison signal when a voltage value of the generated reference signal is greater than or equal to a voltage value of an analog signal (when the reference signal increases) or when the voltage value of the generated reference signal is less than or equal to the voltage value of the analog signal (when the reference signal decreases). In addition, for example, there is a method of generating a standard signal and an integral signal that increases or decreases at a slope corresponding to a magnitude of an analog signal and outputting a comparison signal when a voltage value of the generated integral signal is greater than or equal to a voltage value of the standard signal (when the integral signal increases) or when the voltage value of the generated integral signal is less than or equal to the voltage value of the standard signal (when the integral signal decreases).

As described above, the ring oscillator circuit 181 of this embodiment includes the NAND circuit I1 (first starting inverting circuit), the NAND circuit I12 (second starting inverting circuit), and the NAND circuit I5 (third starting inverting circuit). The ring oscillator circuit 181 of this embodiment causes the second reset pulse to be generated in addition to the main pulse and the reset pulse, and causes the three pulses of the main pulse, the reset pulse, and the second reset pulse to simultaneously circulate. The switching of each inverting circuit to the reset state according to the second reset pulse is performed before the reset pulse. Thereby, it is possible to cause the reset pulse (second reset pulse) to significantly precede the main pulse as compared to the ring oscillator circuit of the related art. Thereby, the ring oscillator circuit 181 of this embodiment can implement a state in which the speed of the main pulse is lower than the speed of the reset pulse even when the delay times required for signal inversions of the inverting circuits I1 to I16 are identical.

Accordingly, it is possible to secure a stable oscillation operation, for example, without having to changing the threshold voltage of the inverting circuit, so as to set the speed of the reset pulse recommended in the ring oscillator circuit of the related art to be higher than the speed of the main pulse, that is, so as to set the speed of the main pulse to be low. Further, the ring oscillator circuit 181 of this embodiment can set the speed of the main pulse to be higher than the speed of the reset pulse and improve the resolution (accuracy) of a digital value by setting the speed of the main pulse to be high.

Second Embodiment

Figure 3:
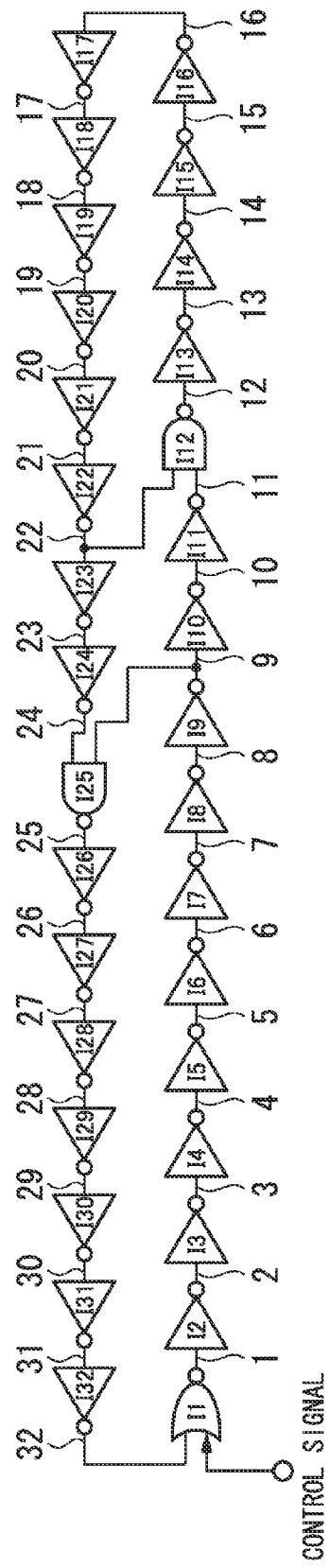
FIG. 3 is a block diagram illustrating a configuration of a ring oscillator circuit according to a second embodiment of the present invention.

Next, a ring oscillator circuit of the second embodiment will be described. FIG. 3 is a block diagram illustrating a configuration of the ring oscillator circuit according to this embodiment. FIG. 3 illustrates the case in which a negative OR circuit (NOR circuit), negative AND circuits (NAND circuits), and logical NOT circuits (inverter circuits) are combined and configured as inverting circuits in a ring oscillator circuit constituted by 32 (stage) inverting circuits. In FIG. 3, the ring oscillator circuit 182 includes a NOR circuit I1, inverter circuits I2 to I9 of 8 stages (an even number of stages), inverter circuits I10 and I11 of 2 stages (an even number of stages), a NAND circuit I12, inverter circuits I13 to I22 of 10 stages (an even number of stages), inverter circuits I23 and I24 of 2 stages (an even number of stages), a NAND circuit I25, and inverter circuits I26 to I32 of 7 stages (an odd number of stages).

The NOR circuit I1 functions as a first starting inverting circuit that starts driving of a main pulse (first pulse signal) based on a control signal. The NAND circuit I25 functions as a second starting inverting circuit that starts driving of a reset pulse (second pulse signal) based on the main pulse. The NAND circuit I12 functions as a third starting inverting circuit that starts driving of a second reset pulse (third pulse signal) based on the main pulse after the reset pulse is driven. The other inverter circuits I2 to I9, inverter circuits I10 and I11, inverter circuits I13 to I22, inverter circuits I23 and I24, and inverter circuits I26 to I32 function as inverting circuits that transfer the input main pulse, reset pulse, and second reset pulse to the inverting circuits of the next stages.

The NOR circuit I1 starts driving of the main pulse by inverting the input control signal. The NAND circuit I25 starts driving of the reset pulse based on the input main pulse after the main pulse is transferred and output from the inverter circuit I9.

The NAND circuit I12 starts driving of the second reset pulse based on the input main pulse after the reset pulse is driven by the NAND circuit I25 and the main pulse is transferred and output from the inverter circuit I22.

In addition, the NOR circuit I1 resets the main pulse based on the input reset pulse after the reset pulse is transferred and output from the inverter circuit I32. In addition, before the reset of the main pulse, the second reset pulse resets the main pulse of an inverting circuit of a stage after the NAND circuit I12. Thereafter, the NOR circuit I1 restarts driving of the main pulse based on the input previous main pulse after the previously driven main pulse is transferred and output from the inverter circuit I32.

In the ring oscillator circuit 182, the NOR circuit I1 drives the main pulse, the NAND circuit I25 drives the reset pulse, and the NAND circuit I12 drives the second reset pulse. The inverter circuits I2 to I9, I10, I11, I13 to I22, I23, and I24 and the inverter circuits I26 to I32 transfer each pulse. As described above, three pulses of the main pulse, the reset pulse, and the second reset pulse simultaneously circulate in the ring oscillator circuit 182, so that an oscillation operation is performed.

Here, the relationship of the number of stages of inverting circuits within the ring oscillator circuit will be described with reference to differences from the ring oscillator circuit 181 illustrated in FIG. 1 and the ring oscillator circuit 182 of the second embodiment illustrated in FIG. 3. In the following description, the NOR circuit I1, the inverter circuits I2 to I9, the inverter circuits I10 and I11, the NAND circuit I12, the inverter circuits I13 to I22, the inverter circuits I23 and I24, the NAND circuit I25, and the inverter circuits I26 to I32 illustrated in FIG. 3 are also referred to as the inverting circuits I1 to I32, respectively. In the description of differences of the configuration of the ring oscillator circuit, the number of inverting-circuit stages corresponding to positions of the inverter circuits I2 to I9 within the ring oscillator circuit 182 of this embodiment illustrated in FIG. 3 is described as "N," the number of inverting-circuit stages corresponding to positions of the inverter circuits I10 and I11 is described as "M," the number of inverting-circuit stages corresponding to positions of the inverter circuits I13 to I22 is described as "P," the number of inverting-circuit stages corresponding to positions of the inverter circuits I23 and I24 is described as "Q," and the number of inverting-circuit stages corresponding to positions of the inverter circuits I26 to I32 is described as "S" in order to facilitate the description.

There is a constant relationship in the number of stages of the inverting circuits other than the first to third starting inverting circuits within the ring oscillator circuit. More specifically, there is a relationship in which the total number of stages (N stages+S stages) including the inverting circuits of the N stages and the inverting circuits of the S stages is an odd number, the number of stages (P stages) is an even number, and the total number of stages (M stages+Q stages) including the inverting circuits of the M stages and the inverting circuits of the Q stages is an even number. In addition, there is a relationship in which the number of stages obtained by adding the number of stages of the inverting circuits of (N stages+S stages) to 2 is greater than the number of stages obtained by adding the number of stages of the inverting circuits of (M stages+P stages+Q stages) to 1, that is, (N stages+S stages+2 stages) >(M stages+P stages+Q stages+1 stage).

In the ring oscillator circuit 182 illustrated in FIG. 3, the number of stages of the inverting circuits of (N stages+S stages) is 15 (an odd number), the number of stages of the inverting circuits of P stages and the number of stages of the inverting circuits of (M stages+Q stages) are 10 (an even number) and 4 (an even number), respectively, and the above-described relationship is established.

In addition, the number of stages of the inverting circuits of (N stages+S stages+2 stages) is 17, the number of stages of the inverting circuits of (M stages+P stages+Q stages+1 stage) is 15, and the above-described relationship is established.

This relationship is also the same as in the ring oscillator circuit 181 illustrated in FIG. 1. However, in the ring oscillator circuit 181, the above-described relationship is established by setting each of the number of stages of the inverting circuits of M stages and the number of stages of the inverting circuits of Q stages to 0 (an even number), setting the number of stages of the inverting circuits of (N stages +S stages) to 7 (an odd number), and setting the number of stages of the inverting circuits of P stages to 6 (an even number). In addition, the number of stages of inverting circuits of (N stages+S stages+2 stages) is 9, the number of stages of inverting circuits of (M stages+P stages+Q stages+1 stage) is 7, and the above-described relationship is established.

In addition, there is also a constant relationship among the configurations of the first to third starting inverting circuits within the ring oscillator circuit and the number of stages of the inverting circuits other than the first to third starting inverting circuits within the ring oscillator circuit. More specifically, there is a relationship in which the number of stages of the inverting circuits of N stages is an odd number when the configuration of the first starting inverting circuit is the same as that of the second starting inverting circuit. There is a relationship in which the number of stages of the inverting circuits of N stages is an even number when the configuration of the first starting inverting circuit is different from that of the second starting inverting circuit. In addition, there is a relationship in which the total number of stages (N stages+M stages) including the inverting circuits of N stages and the inverting circuits of M stages is an odd number when the configuration of the first starting inverting circuit is the same as that of the third starting inverting circuit. There is a relationship in which the number of stages (N stages+M stages) is an even number when the configuration of the first starting inverting circuit is different from that of the third starting inverting circuit.

In the ring oscillator circuit 181 illustrated in FIG. 1, the above-described relationship is established because the configuration of the NAND circuit I1, which is the first starting inverting circuit, is the same as that of the NAND circuit I12, which is the second starting inverting circuit, and the number of stages of the inverting circuits of N stages is 3 (an odd number). In addition, the above-described relationship is established because the configuration of the NAND circuit I1 is the same as that of the NAND circuit I5, which is the third starting inverting circuit, and the number of stages of inverting circuits of (N stages+M stages) is 3 (an odd number).

In addition, in the ring oscillator circuit 182 illustrated in FIG. 3, the above-described relationship is established because the configuration of the NOR circuit I1, which is the first starting inverting circuit, is different from that of the NAND circuit I25, which is the second starting inverting circuit, and the number of stages of the inverting circuits of N stages is 8 (an even number). In addition, the above-described relationship is established because the configuration of the NOR circuit I1 is different from that of the NAND circuit I12, which is the third starting inverting circuit, and the number of stages of the inverting circuits of (N stages+M stages) is 10 (an even number).

Figure 4:
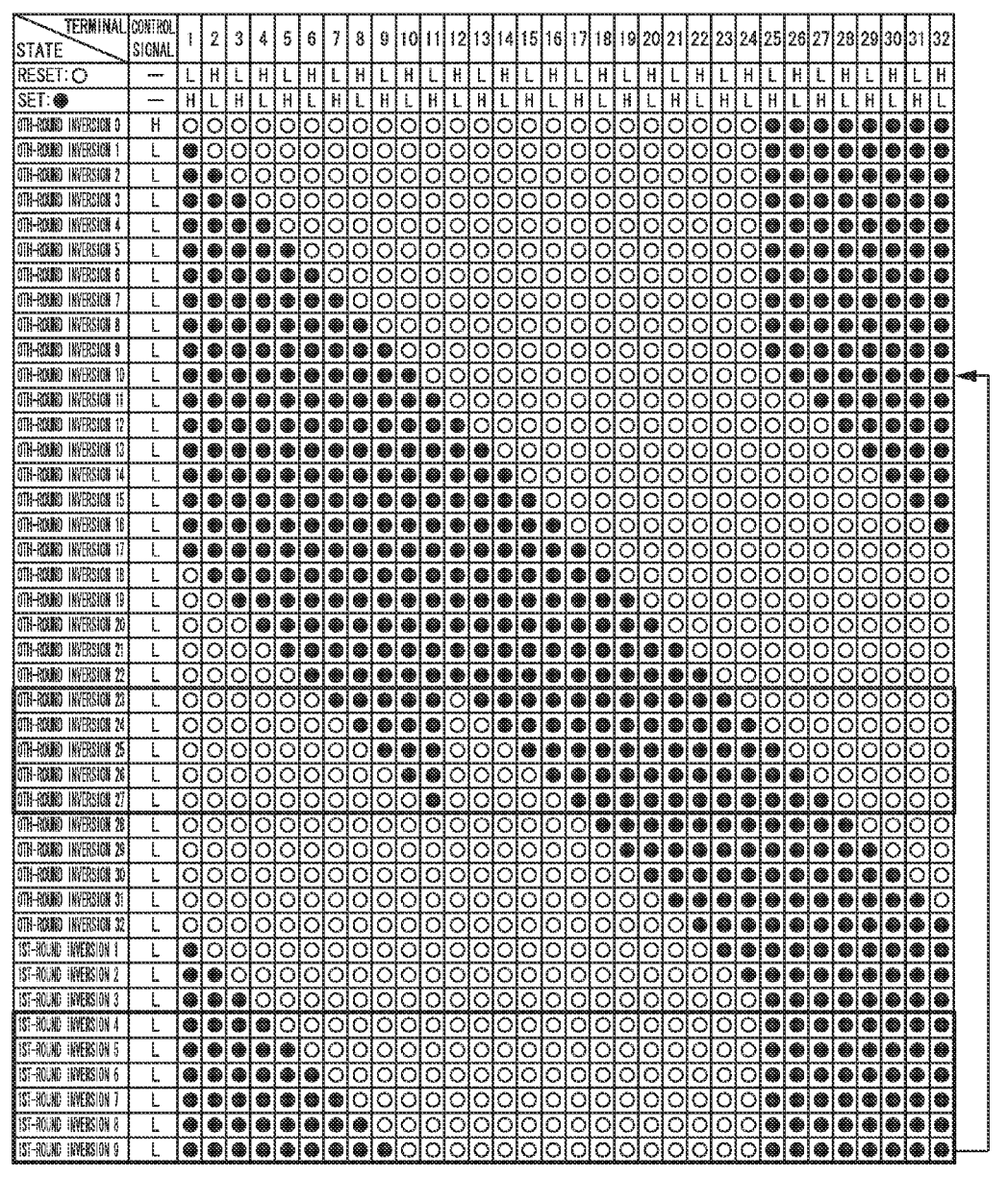

Next, the operation of the ring oscillator circuit 182 of this embodiment will be more specifically described. FIG. 4 is a diagram illustrating operations of the inverting circuits within the ring oscillator circuit 182 of this embodiment. FIG. 4 illustrates states of nodes (signals of output terminals of inverting circuits) under the assumption that delay times required for signal inversions of the inverting circuits I1 to I32 are identical. That is, node positions in which a pulse edge of the main pulse, a pulse edge of the reset pulse, and a pulse edge of the second reset pulse are positioned within the ring oscillator circuit 182 are schematically illustrated in FIG. 4. The viewpoint of FIG. 4 is the same as the transition of the operation of the ring oscillator circuit 181 illustrated in FIG. 2.

The transition of a basic operation of the ring oscillator circuit 182 will be described with reference to FIG. 4. In FIG. 4, a state of 0th-round inversion 0 is a state in which the control signal has the "High" level, the ring oscillator circuit 182 is reset, and no main pulse occurs. Thereafter, the control signal has the "Low" level, so that the ring oscillator circuit 182 starts the operation. If the control signal has the "Low" level, the inverting circuit I1 is switched from the reset state to the set state in 0th-round inversion 1, so that the main pulse is generated and the state of the node 1 is switched to the set state.

Thereafter, the main pulse is sequentially transferred to the inverting circuits I2 to I9 of the next stages, so that the states of the nodes 2 to 9 are sequentially switched to the set state. In 0th-round inversion 10, the inverting circuit I25 is switched from the set state to the reset state according to the state of the node 9, so that the reset pulse is generated and the state of the node 25 is switched to the reset state. The reset pulse is sequentially transferred to the inverting circuits I26 to I32 of the next stages, so that the states of the nodes 26 to 32 are sequentially switched to the reset state. Even after the 0th-round inversion 10, the transfer of the main pulse to the inverting circuit of the next stage continues, and the states of the nodes are sequentially switched to the set state.

Thereafter, in 0th-round inversion 18, the inverting circuit I1 is switched from the set state to the reset state according to the state of the node 32, so that the main pulse is reset and the state of the node 1 is switched to the reset state. The reset state of the main pulse is sequentially transferred to the inverting circuits of the next stages, so that the states of the nodes are sequentially switched to the reset state.

Thereafter, in 0th-round inversion 23, the inverting circuit I12 is switched from the set state to the reset state according to the state of the node 22, so that the second reset pulse is generated and the state of the node 12 is switched to the reset state. The second reset pulse is sequentially transferred to the inverting circuits of the next stages, so that the states of the nodes are sequentially switched to the reset state. Even after 0th-round inversion 23, the transfer of the main pulse to the inverting circuit of the next stage continues and the states of the nodes are sequentially switched to the set state.

0th-round inversion 23 is when the node 23 is switched to the set state by the continuation of the transfer of the main pulse to the inverting circuit I23, and the state of the node 6 is switched to the reset state by the transfer of the reset state of the main pulse to the inverting circuit I6. Further, in 0th-round inversion 23, the second reset pulse switches the state of the node 12 to the reset state before switching to the reset state of the main pulse. That is, 0th-round inversion 23 is when there are simultaneously three pulse edges including the pulse edge of the main pulse, the pulse edge of the reset pulse, and the pulse edge of the second reset pulse. In the ring oscillator circuit 182, the time in which there are simultaneously the three pulse edges continues until 0th-round inversion 27 is reached.

In this period, a positional relationship of the three pulse edges within the ring oscillator circuit 182 is formed in the order of second reset pulse→reset pulse→main pulse if the second reset pulse is set to the head in a circulation direction of the pulse within the ring oscillator circuit 182. As described above, before switching of each inverting circuit to the reset state due to the reset pulse, the second reset pulse causes the reset state to precede the set state by switching each inverting circuit to the reset state.

Thereafter, in the 0th-round inversion 32, the main pulse generated in the 0th-round inversion 1 circulates once within the ring oscillator circuit 182. In the next 1st-round inversion 1, the inverting circuit I1 is re-switched from the reset state to the set state, so that the next main pulse is generated. The next main pulse is sequentially transferred to the inverting circuits within the ring oscillator circuit 182, so that the nodes are sequentially switched to the set state.

After 1st-round inversion 9, the state of each node re-transitions to a state of 0th-round inversion 10. Thereafter, 0th-round inversion 11 to 1st-round inversion 9 and 0th-round inversion 10 are iterated, so that the main pulse continuously circulates around the inverting circuits I1 to I32 connected in the ring within the ring oscillator circuit 182.

Here, when the switching of the main pulse from the set state to the reset state is focused, the inverting circuit I24 is switched to the reset state early in 1st-round inversion 3 in the ring oscillator circuit 182 as illustrated in FIG. 4. This is because the second reset pulse switches the inverting circuit to the reset state after 0th-round inversion 23 before 1st-round inversion 9 in which switching of the inverting circuit I24 to the reset state is performed based on the reset pulse. Thereby, after waiting for the state of the node 9 to be switched to the set state by the main pulse in a period from 1st-round inversion 4 to 1st-round inversion 9 in the ring oscillator circuit 182, the next reset pulse is generated by returning to 0th-round inversion 10 as the next inversion 10 of the first round.

As described above, even in the ring oscillator circuit 182, the reset pulse and the second reset pulse pass through the inverting circuits within the ring oscillator circuit 182 before the main pulse as in the ring oscillator circuit 181 of the first embodiment illustrated in FIG. 1, so that the state of the node is switched from the set state to the reset state in advance. In this manner, the ring oscillator circuit 182 performs a stable oscillation operation by causing the main pulse, the reset pulse, and the second reset pulse to circulate as in the ring oscillator circuit 181 illustrated in FIG. 1, and converts the time into a digital value by detecting the number of inverting circuits (the number of stages) through which an edge of the main pulse has passed and performing the conversion into a binary number.

Because a configuration in which the ring oscillator circuit 182 converts the time into the digital value is the same as that of the ring oscillator circuit 181 of the first embodiment, detailed description thereof is omitted.

As described above, the ring oscillator circuit 182 of this embodiment includes the NOR circuit I1 (first starting inverting circuit), the NAND circuit I25 (second starting inverting circuit), and the NAND circuit I12 (third starting inverting circuit). Like the ring oscillator circuit 181 illustrated in FIG. 1, the ring oscillator circuit 182 of this embodiment can also cause the reset pulse (second reset pulse) to significantly precede the main pulse as compared to the ring oscillator circuit of the related art, and implement a state in which the speed of the main pulse is lower than the speed of the reset pulse. Thereby, the ring oscillator circuit 182 of this embodiment can also secure a stable oscillation operation without setting the speed of the main pulse to be low. Further, it is possible to improve the resolution (accuracy) of a digital value by setting the speed of the main pulse to be high.

Third Embodiment

Figure 5:
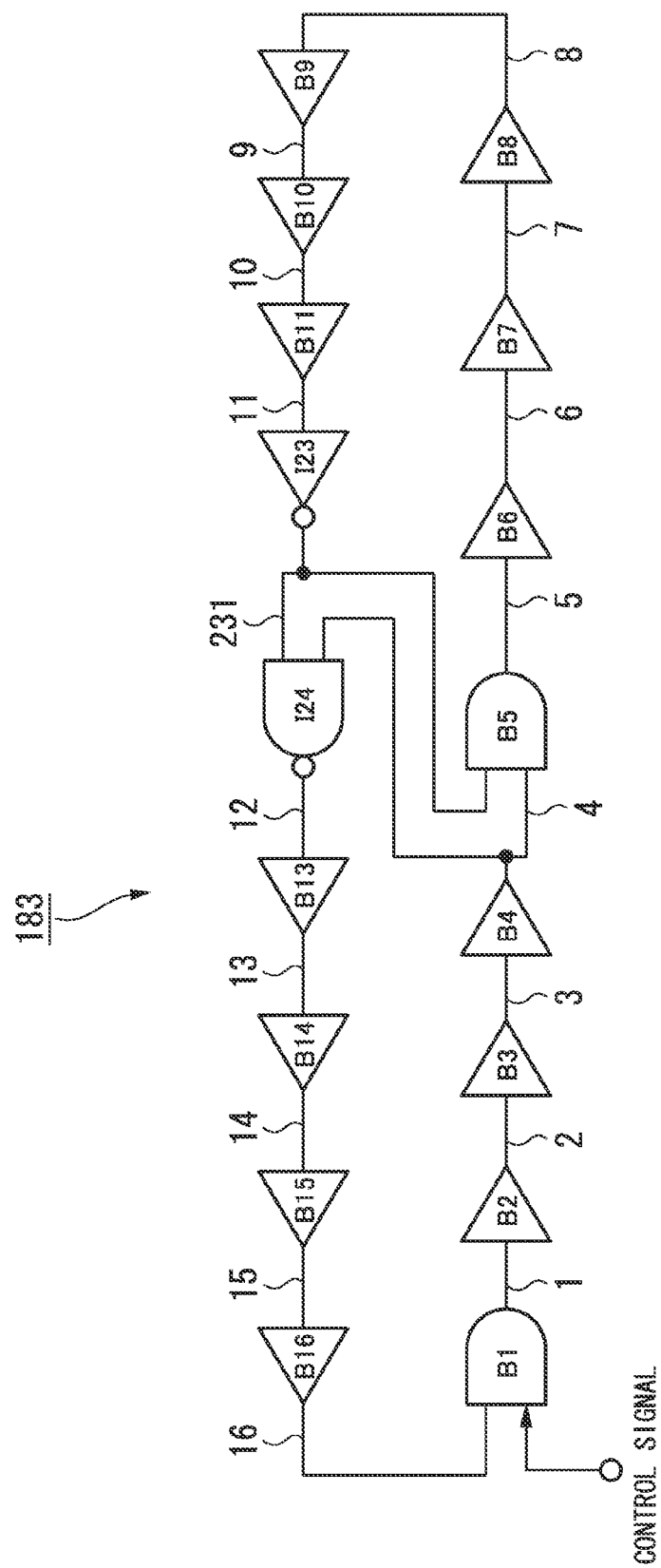
FIG. 5 is a block diagram illustrating a configuration of the ring oscillator circuit according to a third embodiment of the present invention.

Next, a ring oscillator circuit of the third embodiment will be described. FIG. 5 is a block diagram illustrating a configuration of the ring oscillator circuit according to this embodiment. In addition, FIG. 6 is a block diagram in which the configuration of the ring oscillator circuit according to this embodiment is expanded.

FIG. 5 illustrates the case in which logical AND circuits (AND circuits), buffer circuits, a negative AND circuit (NAND circuit), and a logical NOT circuit (inverter circuit) are combined and configured in a ring oscillator circuit constituted by 15 (stage) non-inverting circuits and 2 (stage) inverting circuits. In FIG. 5, the ring oscillator circuit 183 includes an AND circuit B1, buffer circuits B2 to B4 of 3 stages, an AND circuit B5, buffer circuits B6 to B11 of 6 stages, an inverter circuit I23 of 1 stage, a NAND circuit 124, and buffer circuits B13 to B16 of 4 stages.

Here, the AND circuit includes a NAND circuit and an inverter circuit. The buffer circuit includes two inverter circuits. Accordingly, if the AND circuits and the buffer circuits within the ring oscillator circuit 183 are expanded, the ring oscillator circuit 183 illustrated in FIG. 5 becomes a ring oscillator circuit constituted by 32 (stage) inverting circuits as illustrated in FIG. 6.

Figure 6:
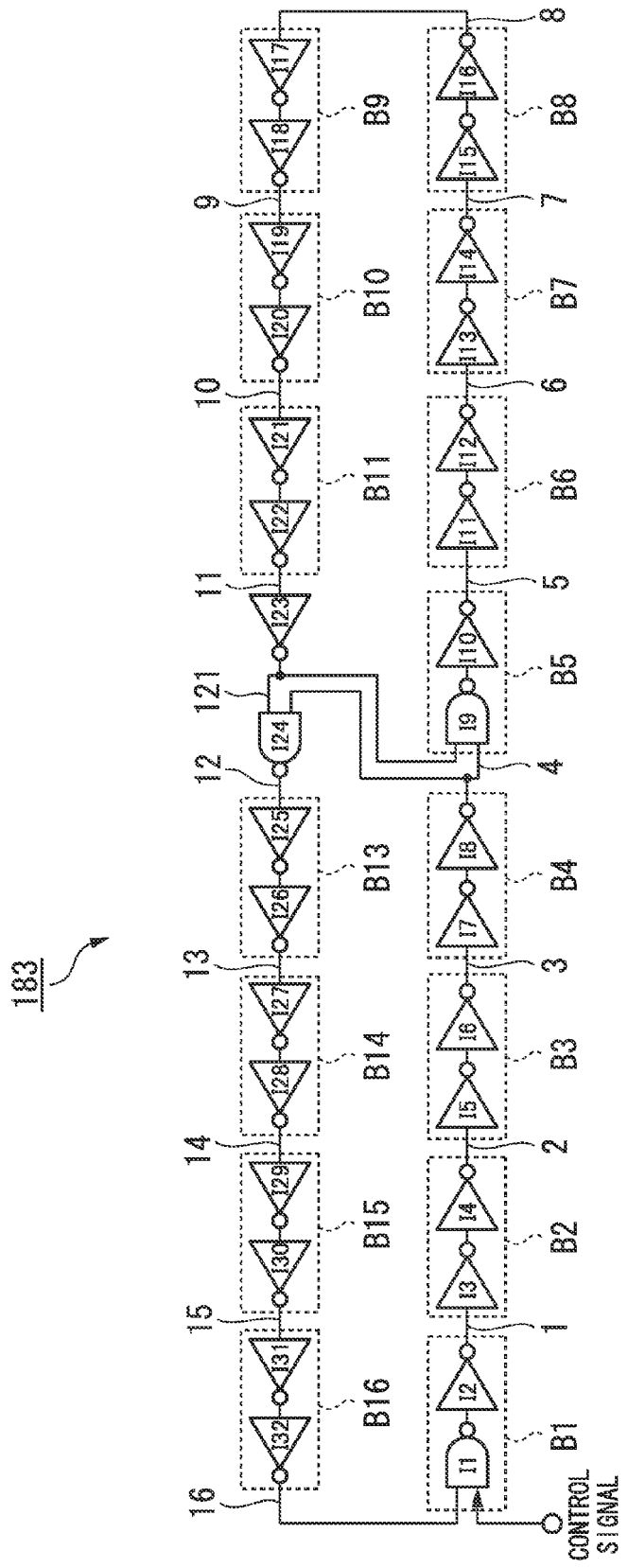
FIG. 6 is a block diagram in which the configuration of the ring oscillator circuit according to the third embodiment of the present invention is expanded.

More specifically, as illustrated in FIG. 6, the AND circuit B1 can be expanded into a NAND circuit I1 and an inverter circuit I2. The buffer circuit B2 can be expanded into inverter circuits I3 and I4. The buffer circuit B3 can be expanded into inverter circuits I5 and I6. The buffer circuit B4 can be expanded into inverter circuits I7 and I8. The AND circuit B5 can be expanded into a NAND circuit I9 and an inverter circuit I10. The buffer circuit B6 can be expanded into inverter circuits I11 and I12. The buffer circuit B7 can be expanded into inverter circuits I13 and I14. The buffer circuit B8 can be expanded into inverter circuits I15 and I16. The buffer circuit B9 can be expanded into inverter circuits I17 and I18. The buffer circuit B10 can be expanded into inverter circuits I19 and I20. The buffer circuit B11 can be expanded into inverter circuits I21 and I22. The buffer circuit B13 can be expanded into inverter circuits I25 and I26. The buffer circuit B14 can be expanded into inverter circuits I27 and I28. The buffer circuit B15 can be expanded into inverter circuits I29 and I30. The buffer circuit B16 can be expanded into inverter circuits I31 and I32.

The NAND circuit I1 within the AND circuit B1 functions as a first starting inverting circuit that starts driving of a main pulse (first pulse signal) based on a control signal. The NAND circuit I24 functions as a second starting inverting circuit that starts driving of a reset pulse (second pulse signal) based on the main pulse. The NAND circuit I9 within the AND circuit B5 functions as a third starting inverting circuit that starts driving of a second reset pulse (third pulse signal) based on the main pulse after the reset pulse is driven. In addition, the inverter circuit I2 within the AND circuit B1, the inverter circuits I3 to I8 within the buffer circuits B2 to B4, the inverter circuit I10 within the AND circuit B5, the inverter circuits I11 to I22 within the buffer circuits B6 to B11, the inverter circuit I23, and the inverter circuits I25 to I32 within the buffer circuits B13 to B16 function as inverting circuits that transfer the input main pulse, reset pulse, and second reset pulse to the inverting circuits of the next stages.

The NAND circuit I1 within the AND circuit B1 starts driving of the main pulse by inverting the input control signal. The NAND circuit I24 starts driving of the reset pulse based on the input main pulse after the main pulse is transferred and output from the inverter circuit I8 within the buffer circuit B4. The NAND circuit I9 within the AND circuit B5 starts driving of the second reset pulse based on the input main pulse after the reset pulse is driven by the NAND circuit I24 and the main pulse is further transferred and output from the inverter circuit I23.

In addition, the NAND circuit I1 within the AND circuit B1 resets the main pulse based on the input reset pulse after the reset pulse is transferred and output from the inverter circuit I32 within the buffer circuit B16. In addition, before the reset of the main pulse, the second reset pulse resets the main pulse of an inverting circuit of a stage after the NAND circuit I9 within the buffer circuit B5. Thereafter, the NAND circuit I1 within the AND circuit B1 restarts driving of the main pulse based on the input previous main pulse after the previously driven main pulse is transferred and output from the inverter circuit I32 within the buffer circuit B16.

In the ring oscillator circuit 182, the NAND circuit I1 within the AND circuit B1 drives the main pulse, the NAND circuit I24 drives the reset pulse, and the NAND circuit I9 within the buffer circuit B5 drives the second reset pulse. The inverter circuit I2 within the AND circuit B1, the inverter circuits I3 to I8 within the buffer circuits B2 to B4, the inverter circuit I10 within the AND circuit B5, the inverter circuits I11 to I22 within the buffer circuits B6 to B11, the inverter circuit I23, and the inverter circuits I25 to I32 within the buffer circuits B13 to B16 transfer each pulse. As described above, three pulses of the main pulse, the reset pulse, and the second reset pulse simultaneously circulate in the ring oscillator circuit 183, so that an oscillation operation is performed.

Here, with reference to FIG. 6, the correspondence of the ring oscillator circuit 183 is checked with respect to the relationship of the number of stages of inverting circuits within the ring oscillator circuit. In the ring oscillator circuit 183 illustrated in FIG. 6, each of the number of stages of inverting circuits of M stages and the number of stages of inverting circuits of Q stages is 0 (an even number).

If the number of stages of inverting circuits within the ring oscillator circuit is checked in consideration of this, the number of stages of inverting circuits of (N stages+S stages) is 15 (an odd number) and the number of stages of inverting circuits of P stages is 14 (an even number) as can be seen from FIG. 6. In addition, the number of stages of inverting circuits of (N stages+S stages+2 stages) is 17. Further, the number of stages of inverting circuits of (M stages+P stages+Q stages+1 stage) is 15. Thus, the relationship of the number of stages of the inverting circuits other than the first to third starting inverting circuits within the above-described ring oscillator circuit is established.

In addition, in the ring oscillator circuit 183, the configuration of the NAND circuit I1, which is the first starting inverting circuit, is the same as that of the NAND circuit I24, which is the second starting inverting circuit. Thus, the number of stages of the inverting circuits of N stages is 7 (an odd number). In addition, because the configuration of the NAND circuit I1 is the same as that of the NAND circuit I9, which is the third starting inverting circuit, the number of stages of the inverting circuits of (N stages+M stages) is 7 (an odd number). Accordingly, the relationship among the configurations of the first to third starting inverting circuits within the above-described ring oscillator circuit and the number of stages of the inverting circuits other than the first and third starting inverting circuits within the ring oscillator circuit is established.

Next, the operation of the ring oscillator circuit 183 of this embodiment will be more specifically described. In the following description, the AND circuit B1, the buffer circuits B2 to B4, the AND circuit B5, the buffer circuits B6 to B11, and the buffer circuits B13 to B16 illustrated in FIG. 5 are also referred to as the non-inverting circuits B1 to B11 and B13 to B16, respectively. In addition, the inverter circuit I23 and the NAND circuit I24 are also referred to as the inverting circuits I23 and I24, respectively. In addition, when the inverter circuit I23 and the NAND circuit I24 are collectively expressed as a non-inverting circuit, it is also referred to as a non-inverting circuit B12.

FIG. 7 is a diagram illustrating operations of the inverting circuits within the ring oscillator circuit 183 of this embodiment. FIG. 7 illustrates states of nodes (signals of output terminals of non-inverting circuits) under the assumption that delay times required for signal transfers of the non-inverting circuits B1 to B16 are identical. That is, in FIG. 7, node positions in which a pulse edge of the main pulse, a pulse edge of the reset pulse, and a pulse edge of the second reset pulse are positioned within the ring oscillator circuit 183 are schematically illustrated. The viewpoint of FIG. 7 is the same as the transition of the operation of the ring oscillator circuit 181 illustrated in FIG. 2.

The transition of a basic operation of the ring oscillator circuit 183 will be described with reference to FIG. 7. In FIG. 7, a state of 0th-round inversion 0 is a state in which the inverted signal has the "Low" level, the ring oscillator circuit 183 is reset, and no main pulse occurs. Thereafter, the control signal has the "High" level, so that the ring oscillator circuit 183 starts the operation. If the control signal has the "High" level, the non-inverting circuit B1 is switched from the reset state to the set state in 0th-round inversion 1, so that the main pulse is generated and the state of the node 1 is switched to the set state.

Thereafter, the main pulse is sequentially transferred to the non-inverting circuits B2 to B4 of the next stages, so that the states of the nodes 2 to 4 are sequentially switched to the set state. In 0th-round inversion 5, the inverting circuit I24 is switched from the set state to the reset state according to the state of the node 4, so that the reset pulse is generated and the state of the node 12 is switched to the reset state. The reset pulse is sequentially transferred to the non-inverting circuits B13 to B16 of the next stages, so that the states of the nodes 13 to 16 are sequentially switched to the reset state. Even after the 0th-round inversion 5, the transfer of the main pulse to the non-inverting circuit of the next stage continues, and the states of the nodes are sequentially switched to the set state.

Thereafter, in 0th-round inversion 10, the non-inverting circuit B1 is switched from the set state to the reset state according to the state of the node 16, so that the main pulse is reset and the state of the node 1 is switched to the reset state. The reset state of the main pulse is sequentially transferred to the non-inverting circuits of the next stages, so that the states of the nodes are sequentially switched to the reset state.

Thereafter, in 0th-round inversion 12, the non-inverting circuit B5 is switched from the set state to the reset state according to a state of a signal of an output terminal of the next inverting circuit I23 of the node 11, so that the second reset pulse is generated and the state of the node 5 is switched to the reset state. The second reset pulse is sequentially transferred to the non-inverting circuits of the next stages, so that the states of the nodes are sequentially switched to the reset state. Even after 0th-round inversion 12, the transfer of the main pulse to the non-inverting circuit of the next stage continues and the states of the nodes are sequentially switched to the set state. Incidentally, inverting circuits of two stages are arranged between the node 11 and the node 12, and inverting circuits of three stages are arranged between the node 11 and the node 5. Thus, assuming that times required for inversions of the inverting circuits are exactly identical, the node 5 is switched from the set state to the reset state in a short period in which the time of 0th-round inversion 12. However, the state of the time of 0th-round inversion 12 of FIG. 7 is a state after the node 5 has been switched to the reset state.

0th-round inversion 12 is when the node 12 is switched to the set state by the continuation of the transfer of the main pulse to the inverting circuit I24, and the state of the node 3 is switched to the reset state by the transfer of the reset state of the main pulse to the non-inverting circuit B3. Further, in 0th-round inversion 12, the second reset pulse switches the state of the node 5 to the reset state before switching to the reset state of the main pulse. That is, 0th-round inversion 12 is when there are simultaneously three pulse edges including the pulse edge of the main pulse, the pulse edge of the reset pulse, and the pulse edge of the second reset pulse.

At this time, a positional relationship of the three pulse edges within the ring oscillator circuit 183 is formed in the order of second reset pulse→reset pulse→main pulse if the second reset pulse is set to the head in a circulation direction of the pulse within the ring oscillator circuit 183. As described above, before switching of each non-inverting circuit to the reset state due to the reset pulse, the second reset pulse causes the reset state to precede the set state by switching each non-inverting circuit to the reset state.

Thereafter, in the 0th-round inversion 16, the main pulse generated in the 0th-round inversion 1 circulates once within the ring oscillator circuit 183. In the next 1st-round inversion 1, the non-inverting circuit B1 is re-switched from the reset state to the set state, so that the next main pulse is generated. The next main pulse is sequentially transferred to the non-inverting circuits within the ring oscillator circuit 183, so that the nodes are sequentially switched to the set state.

After 1st-round inversion 4, the state of each node re-transitions to a state of 0th-round inversion 5.

Thereafter, 0th-round inversion 6 to 1st-round inversion 4 and 0th-round inversion 5 are iterated, so that the main pulse continuously circulates around the non-inverting circuits B1 to B16 connected in the ring within the ring oscillator circuit 183.

Here, when the switching of the main pulse from the set state to the reset state is focused, the non-inverting circuit B11 is switched to the reset state early in 1st-round inversion 2 in the ring oscillator circuit 183 as illustrated in FIG. 7. This is because the second reset pulse switches the non-inverting circuit to the reset state after 0th-round inversion 12 before $1^{st}$-round inversion 4 in which switching of the non-inverting circuit B11 to the reset state is performed based on the reset pulse. Thereby, after waiting for the state of the node 4 to be switched to the set state by the main pulse in 1st-round inversion 3 and $1^{st}$-round inversion 4 in the ring oscillator circuit 183, the next reset pulse is generated by returning to 0th-round inversion 5 as the next inversion 5 of the first round.

As described above, even in the ring oscillator circuit 183, the reset pulse and the second reset pulse pass through the non-inverting circuits within the ring oscillator circuit 183 before the main pulse as in the ring oscillator circuit 181 of the first embodiment illustrated in FIG. 1, so that the state of the node is switched from the set state to the reset state in advance. In this manner, the ring oscillator circuit 183 performs a stable oscillation operation by causing the main pulse, the reset pulse, and the second reset pulse to circulate as in the ring oscillator circuit 181 illustrated in FIG. 1, and converts the time into a digital value by detecting the number of non-inverting circuits (the number of stages) through which an edge of the main pulse has passed and performing the conversion into a binary number.

Because a configuration in which the ring oscillator circuit 183 converts the time into the digital value is the same as that of the ring oscillator circuit 181 of the first embodiment, detailed description thereof is omitted.

As described above, the ring oscillator circuit 183 of this embodiment includes the NAND circuit I1 (first starting inverting circuit) within the AND circuit B1, the NAND circuit I24 (second starting inverting circuit), and the NAND circuit I9 (third starting inverting circuit) within the AND circuit B5. Like the ring oscillator circuit 181 illustrated in FIG. 1, the ring oscillator circuit 183 of this embodiment can also cause the reset pulse (second reset pulse) to significantly precede the main pulse as compared to the ring oscillator circuit of the related art, and implement a state in which the speed of the main pulse is lower than the speed of the reset pulse. Thereby, the ring oscillator circuit 183 of this embodiment can also secure a stable oscillation operation without setting the speed of the main pulse to be low. Further, it is possible to improve the resolution (accuracy) of a digital value by setting the speed of the main pulse to be high.

In addition, in the ring oscillator circuit 183 of this embodiment, the reset pulse (second reset pulse) significantly precedes the main pulse as described above. Thus, even when the speed of the main pulse is set to be higher than the speed of the reset pulse, the main pulse stably continuously circulates around the non-inverting circuits within the ring oscillator circuit 183. More specifically, it is possible to maintain a stable oscillation operation even when the speed of the main pulse is set to be higher than the speed of the reset pulse by setting threshold voltages of odd-numbered inverting circuits (inverting circuits I1, I3, I5, I7, I9, I11, I13, I15, I17, I19, I21, I23, I25, I27, I29, and I31) within the ring oscillator circuit 183 to be low and setting threshold voltages of even-numbered inverting circuits (inverting circuits I2, I4, I6, I8, I10, I12, I14, I16, I18, I20, I22, I24, I26, I28, I30, and I32) to be high.

At this time, as illustrated in FIG. 6, within non-inverting circuits, inverting circuits of which upper and lower levels of the threshold values are inverted are arranged side by side and delay speeds of adjacent inverting circuits are different. However, in the ring oscillator circuit 183, the non-inverting circuits B1 to B16 are configured as one set of inverting circuits of which the threshold values rise and fall. Thus, a delay time necessary for a signal transfer is approximately constant in units of non-inverting circuits. Consequently, the ring oscillator circuit 183 of this embodiment can suppress the variability of the delay time between nodes illustrated in FIG. 5 to be small. Thereby, it is also possible to suppress the variability between bits when the time is converted into a digital value.

As described above, the ring oscillator circuit can accommodate the speed-up of the main pulse while securing a stable oscillation operation by implementing the ring oscillator circuit that has the same configuration as the ring oscillator circuits of the first to third embodiments.

Fourth Embodiment

Figure 8:
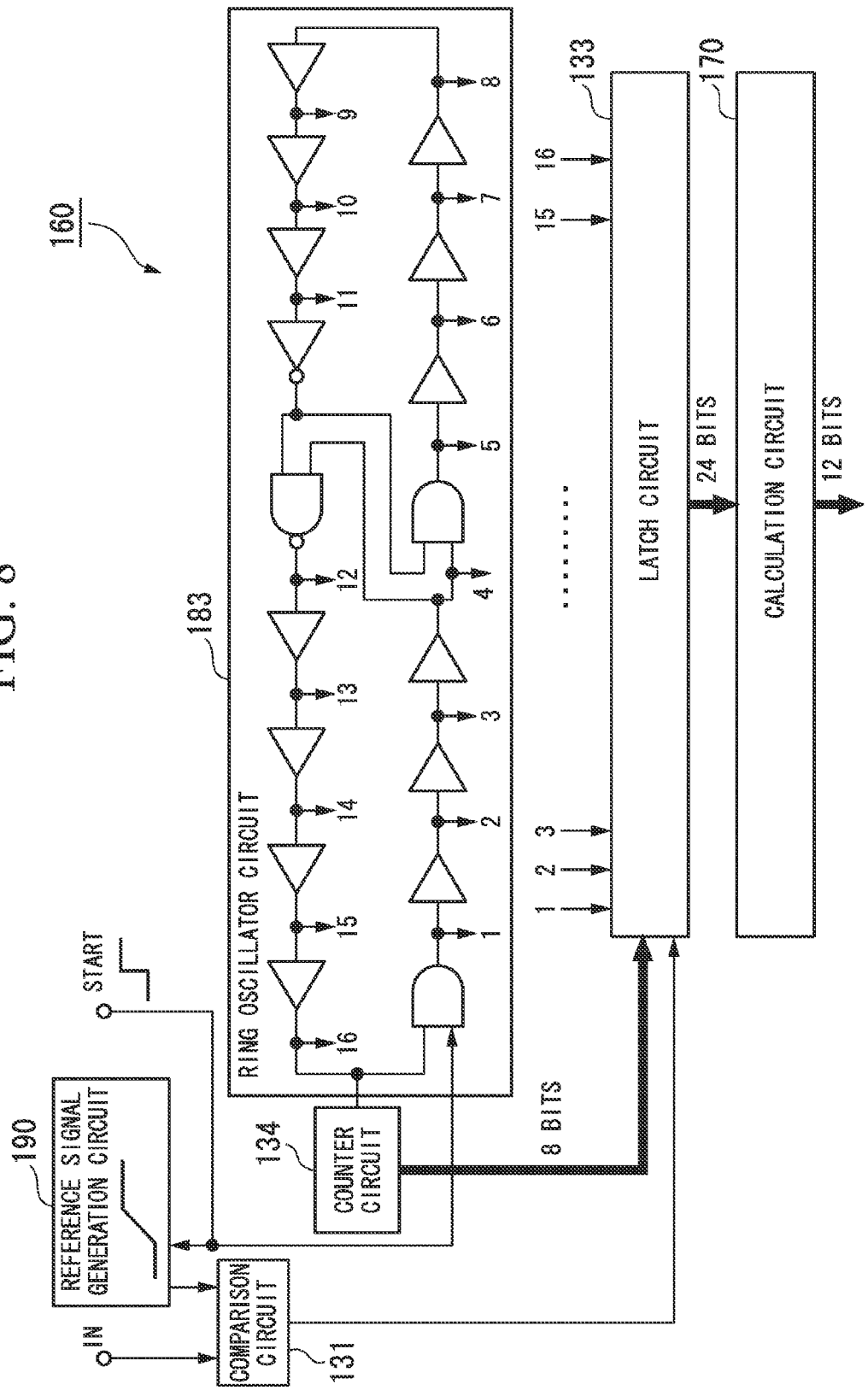
FIG. 8 is a block diagram illustrating a configuration of a single-slope A/D conversion circuit according to a fourth embodiment of the present invention.

Next, a single-slope A/D conversion circuit having a ring oscillator circuit will be described. FIG. 8 is a block diagram illustrating a configuration of the single-slope A/D conversion circuit according to this embodiment. In FIG. 8, the single-slope A/D conversion circuit 160 includes the ring oscillator circuit 183, a reference signal generation circuit 190, a comparison circuit 131, a counter circuit 134, a latch circuit 133, and a calculation circuit 170. A configuration including the ring oscillator circuit 183, the counter circuit 134, the latch circuit 133, the reference signal generation circuit 190, and the comparison circuit 131 may also be a ring oscillator circuit. The A/D conversion circuit 160 illustrated in FIG. 8 is an example in which the ring oscillator circuit 183 of the third embodiment illustrated in FIG. 5 is applied. Accordingly, the same components as those of the ring oscillator circuit 183 illustrated in FIG. 5 are denoted by the same reference numerals in the following description, and detailed description thereof is omitted.

According to an input start signal, the reference signal generation circuit 190 generates a ramp wave having a constant slope and outputs the generated ramp wave to the comparison circuit 131. The comparison circuit 131 compares an in signal, which is an analog signal of a target of A/D conversion, to the ramp wave input from the reference signal generation circuit 190. The comparison circuit 131 outputs a latch signal to the latch circuit 133 at a timing at which the logic of the in signal and the ramp wave is inverted. For example, the comparison circuit 131 makes a comparison of a magnitude relationship between a potential of the in signal and a potential of the ramp wave, and outputs a latch signal at a timing at which the magnitude relationship between the potential of the in signal and the potential of the ramp wave is switched.

The ring oscillator circuit 183 receives an input of the start signal as a control signal, and performs an oscillation operation for causing the main pulse to circulate based on the start signal. The counter circuit 134 detects a change in the state of the node 16 within the ring oscillator circuit 183, and counts the number of circulations of the main pulse. At a timing at which the latch signal has been input from the comparison circuit 131, the latch circuit 133 latches the states of the nodes 1 to 16 (logical values of the non-inverting circuits B1 to B16) within the ring oscillator circuit 183. In addition, the latch circuit 133 latches the number of circulations of the main pulse counted by the counter circuit 134 at a timing at which the latch signal has been input from the comparison circuit 131.

The calculation circuit 170 calculates the number of circulations of the main pulse latched by the latch circuit 133 and the logical values of the non-inverting circuits B1 to B16, thereby performing the conversion into a binary digital value. The calculation circuit 170 outputs the digital value generated by the conversion as a digital value corresponding to an analog signal subjected to A/D conversion by the A/D conversion circuit 160.

Next, an operation of A/D conversion in the single-slope A/D conversion circuit 160 will be specifically described.

When the analog signal serving as the target of A/D conversion is input as the in signal, the reference signal generation circuit 190 outputs the ramp wave at a timing of switching of the start signal if the start signal is switched from the "Low" level to the "High" level. In addition, simultaneously, the ring oscillator circuit 183 starts the operation and the main pulse circulates around the inside of the ring oscillator circuit 183.

The counter circuit 134 counts the number of circulations of the main pulse within the ring oscillator circuit 183 by 8 bits of a binary number.

The comparison circuit 131 compares the in signal to the ramp wave. For example, when the in signal has a positive potential, and an initial potential of the ramp wave is a ground potential, the comparison circuit 131 outputs the latch signal at a timing at which the potential of the ramp wave has exceeded the potential of the in signal.

If the latch signal is input from the comparison circuit 131, the latch circuit 133 latches a count value (8 bit) of the counter circuit 134 and logical values (16 bit) of the nodes 1 to 16 of the ring oscillator circuit 183. The latch circuit 133 outputs data of a total of 24 bit in which the count value (8 bit) is designated as high-order bit and the logical values (16 bit) of the nodes are designated as low-order bit to the calculation circuit 170.

As described above, the ramp wave has a constant slope. Thus, as the potential of the in signal is higher, a timing at which the potential of the ramp wave exceeds the potential of the in signal becomes later and a timing at which the comparison circuit 131 outputs the latch signal also becomes later. In addition, as the potential of the in signal is lower, a timing at which the potential of the ramp wave exceeds the potential of the in signal becomes earlier and a timing at which the comparison circuit 131 outputs the latch signal also becomes earlier.

That is, a time from a timing at which the start signal has been switched from the "Low" level to the "High" level and the operation of A/D conversion has been started to when the comparison circuit 131 outputs the latch signal is proportional to the potential of the in signal, that is, the analog signal. Accordingly, a time for which the main pulse circulates around the inside of the ring oscillator circuit 183 is proportional to the potential of the analog signal, and the number of circulations of the main pulse and the logical value of each node are also proportional to the potential of the analog signal. Thus, it is possible to obtain the digital value proportional to the analog signal by converting the number of circulations of the main pulse and the logical value of each node.

The calculation circuit 170 calculates a node position in which a pulse edge of the main pulse, which is circulating around the inside of the ring oscillator circuit 183, is positioned from 16 low-order bit of data input from the latch circuit 133, that is, the logical values of the nodes within the ring oscillator circuit 183, at a point in time when the latch has been performed. That is, the calculation circuit 170 calculates the number of stages of non-inverting circuits through which the main pulse has passed at a point in time when the latch has been performed, and converts the calculated number into a digital value of a binary number (4 bit). The calculation circuit 170 outputs a digital value of a total of 12 bit in which 8 high-order bit of data input from the latch circuit 133, that is, the number of circulations of the main pulse, are high-order bit and the calculated digital value (4 bit) is low-order bit as the digital value corresponding to the analog signal subjected to A/D conversion by the A/D conversion circuit 160.

As described above, the single-slope A/D conversion circuit 160 of this embodiment converts an input analog signal to a digital value using the ring oscillator circuit 183. Here, the ring oscillator circuit 183 can set the speed of the main pulse to be high in a stable oscillation operation as described in the third embodiment. Thus, in the single-slope A/D conversion circuit 160, it is possible to more finely divide a time from a timing at which the start signal has been switched from the "Low" level to the "High" level and the A/D conversion operation has been started to when the latch circuit 133 latches a count value of the counter circuit 134 and the logical values of the nodes of the ring oscillator circuit 183. Thus, the single-slope A/D conversion circuit 160 of this embodiment can improve the resolution (accuracy) of a digital value of A/D conversion. That is, in the single-slope A/D conversion circuit 160 of this embodiment, it is possible to implement a high-resolution, single-slope A/D conversion circuit that stably operates.

Fifth Embodiment

Figure 9:
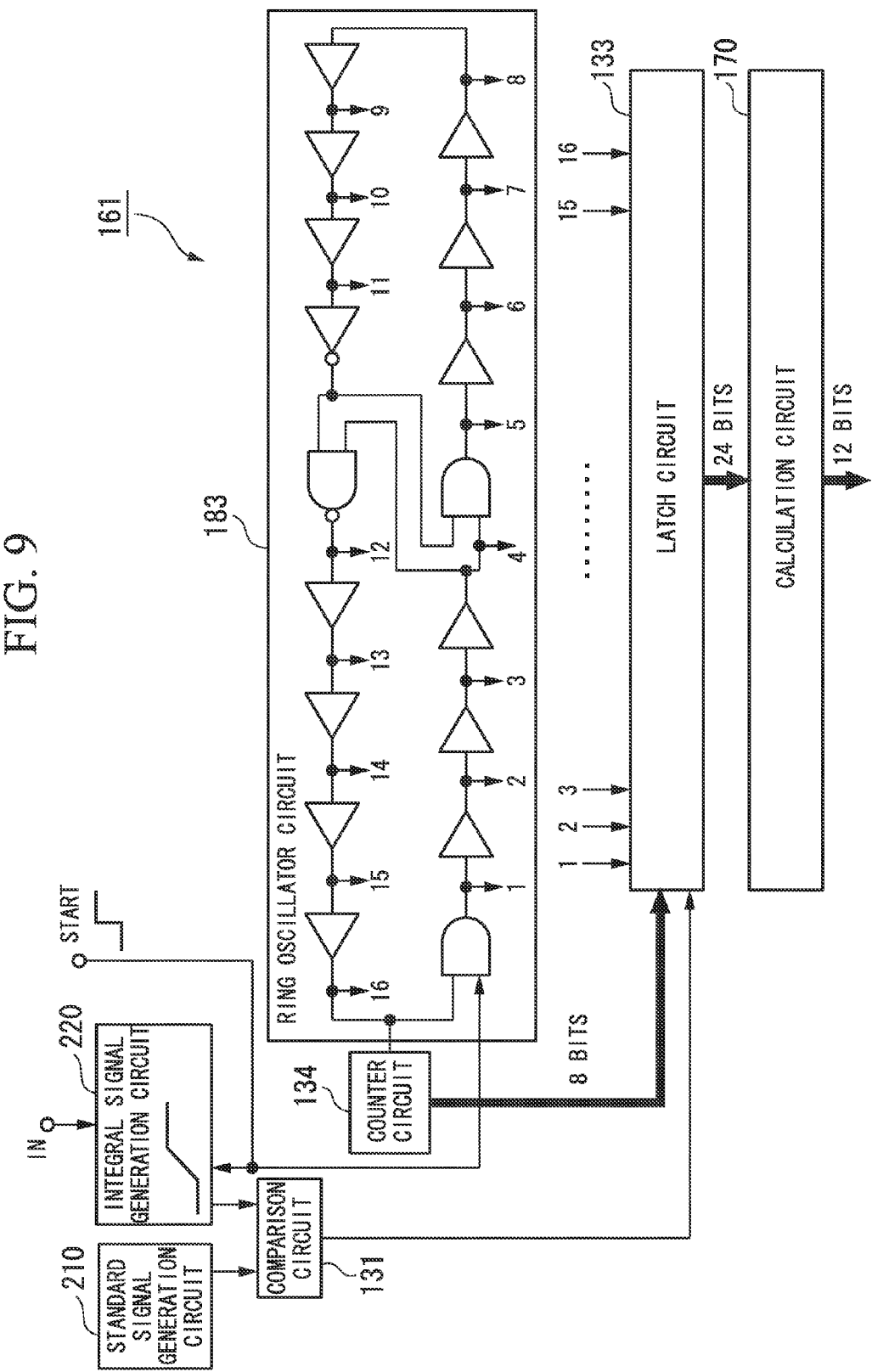
FIG. 9 is a block diagram illustrating a configuration of an integral A/D conversion circuit according to a fifth embodiment of the present invention.

Next, an integral A/D conversion circuit having a ring oscillator circuit will be described. FIG. 9 is a block diagram illustrating a configuration of the integral A/D conversion circuit according to this embodiment. In FIG. 9, the integral A/D conversion circuit 161 includes the ring oscillator circuit 183, a standard signal generation circuit 210, an integral signal generation circuit 220, a comparison circuit 131, a counter circuit 134, a latch circuit 133, and a calculation circuit 170. A configuration including the ring oscillator circuit 183, the counter circuit 134, the latch circuit 133, the standard signal generation circuit 210, the integral signal generation circuit 220, and the comparison circuit 131 may also be a ring oscillator circuit. The A/D conversion circuit 161 illustrated in FIG. 9 is an example in which the ring oscillator circuit 183 of the third embodiment illustrated in FIG. 5 is applied. Accordingly, the same components as those of the ring oscillator circuit 183 illustrated in FIG. 5 are denoted by the same reference numerals in the following description, and detailed description thereof is omitted.

The standard signal generation circuit 210 generates a direct current (DC) signal of a constant potential serving as a standard when A/D conversion is performed, and outputs the generated DC signal to the comparison circuit 131. According to an input start signal, the integral signal generation circuit 220 generates a ramp wave having a slope proportional to a magnitude of an in signal, which is an analog signal of a target of A/D conversion, and outputs the generated ramp wave to the comparison circuit 131. The comparison circuit 131 compares the DC signal input from the standard signal generation circuit 210 to the ramp wave input from the integral signal generation circuit 220. The comparison circuit 131 outputs a latch signal to the latch circuit 133 at a timing at which the logic of the DC signal and the ramp wave is inverted. For example, the comparison circuit 131 makes a comparison of a magnitude relationship between a potential of the DC signal and a potential of the ramp wave, and outputs a latch signal at a timing at which the magnitude relationship between the potential of the DC signal and the potential of the ramp wave is switched.

The ring oscillator circuit 183 receives an input of the start signal as a control signal, and performs an oscillation operation of causing the main pulse to circulate based on the start signal. The counter circuit 134 detects a change in the state of the node 16 within the ring oscillator circuit 183, and counts the number of circulations of the main pulse. At a timing at which the latch signal has been input from the comparison circuit 131, the latch circuit 133 latches the states of the nodes 1 to 16 (logical values of the non-inverting circuits B1 to B16) within the ring oscillator circuit 183. In addition, the latch circuit 133 latches the number of circulations of the main pulse counted by the counter circuit 134 at a timing at which the latch signal has been input from the comparison circuit 131.

The calculation circuit 170 calculates the number of circulations of the main pulse latched by the latch circuit 133 and the logical values of the non-inverting circuits B1 to B16, thereby performing the conversion into a binary digital value. The calculation circuit 170 outputs the digital value generated by the conversion as a digital value corresponding to an analog signal subjected to A/D conversion by the A/D conversion circuit 161.

Next, the A/D conversion operation in the integral A/D conversion circuit 161 will be specifically described.

The standard signal generation circuit 210 outputs a DC signal. When the analog signal serving as the target of A/D conversion is input as the in signal, the integral signal generation circuit 220 outputs the ramp wave at a timing of switching of the start signal if the start signal is switched from the "Low" level to the "High" level. In addition, simultaneously, the ring oscillator circuit 183 starts the operation and the main pulse circulates around the inside of the ring oscillator circuit 183.

The counter circuit 134 counts the number of circulations of the main pulse within the ring oscillator circuit 183 by 8 bit of a binary number.

The comparison circuit 131 compares the DC signal to the ramp wave. For example, when the DC signal has a positive potential, and an initial potential of the ramp wave is a ground potential, the latch signal is output at a timing at which the potential of the ramp wave has exceeded the potential of the DC signal.

If the latch signal is input from the comparison circuit 131, the latch circuit 133 latches a count value (8 bit) of the counter circuit 134 and logical values (16 bit) of the nodes 1 to 16 of the ring oscillator circuit 183. The latch circuit 133 outputs data of a total of 24 bit in which the count value (8 bit) is designated as high-order bit and the logical values (16 bit) of the nodes are designated as low-order bit to the calculation circuit 170.

As described above, the slope of the ramp wave is proportional to the magnitude of the in signal. Thus, in the case of a comparison to the DC signal, which is a constant potential, as the potential of the in signal is higher, a timing at which the potential of the ramp wave exceeds the potential of the DC signal becomes later and a timing at which the comparison circuit 131 outputs the latch signal also becomes later. In addition, as the potential of the in signal is lower, a timing at which the potential of the ramp wave exceeds the potential of the DC signal becomes earlier and a timing at which the comparison circuit 131 outputs the latch signal also becomes earlier.

That is, a time from a timing at which the start signal has been switched from the "Low" level to the "High" level and the operation of A/D conversion has been started to when the comparison circuit 131 outputs the latch signal is proportional to the potential of the in signal, that is, the analog signal. Accordingly, a time for which the main pulse circulates around the inside of the ring oscillator circuit 183 is proportional to the potential of the analog signal, and the number of circulations of the main pulse and the logical value of each node are also proportional to the potential of the analog signal. Thus, it is possible to obtain the digital value proportional to the analog signal by converting the number of circulations of the main pulse and the logical value of each node.

The calculation circuit 170 calculates a node position in which a pulse edge of the main pulse, which is circulating around the inside of the ring oscillator circuit 183, is positioned from 16 low-order bit of data input from the latch circuit 133, that is, the logical values of the nodes within the ring oscillator circuit 183, at a point in time when the latch has been performed. That is, the calculation circuit 170 calculates the number of stages of non-inverting circuits through which the main pulse has passed at a point in time when the latch has been performed, and converts the calculated number into a digital value of a binary number (4 bit). The calculation circuit 170 outputs a digital value of a total of 12 bits in which 8 high-order bit of data input from the latch circuit 133, that is, the number of circulations of the main pulse, are high-order bit and the calculated digital value (4 bit) is low-order bit as the digital value corresponding to the analog signal subjected to A/D conversion by the A/D conversion circuit 161.

As described above, like the single-slope A/D conversion circuit 160 illustrated in FIG. 8, the integral A/D conversion circuit 161 of this embodiment also converts an input analog signal to a digital value using the ring oscillator circuit 183. Here, the ring oscillator circuit 183 can set the speed of the main pulse to be high in a stable oscillation operation as described in the third embodiment. Thus, even in the integral A/D conversion circuit 161, it is possible to more finely divide a time from a timing at which the start signal has been switched from the "Low" level to the "High" level and the A/D conversion operation has been started to when the latch circuit 133 latches a count value of the counter circuit 134 and the logical values of the nodes of the ring oscillator circuit 183. Thus, like the single-slope A/D conversion circuit 160 illustrated in FIG. 8, the integral A/D conversion circuit 161 of this embodiment can also improve the resolution (accuracy) of a digital value generated by A/D conversion. That is, even in the integral A/D conversion circuit 161 of this embodiment, it is possible to implement a high-resolution integral A/D conversion circuit that stably operates.

As described above, it is possible to implement a high-resolution A/D conversion circuit that stably operates by applying the ring oscillator circuit 183 to configure the A/D conversion circuit.

The case in which the ring oscillator circuit 183 is applied to the single-slope A/D conversion circuit 160 of the fourth embodiment and the integral A/D conversion circuit 161 of the fifth embodiment described above has been described. However, the ring oscillator circuit to be applied to the A/D conversion circuit is not limited to the configuration illustrated in FIG. 8 or 9. For example, it is possible to apply the ring oscillator circuit 181 of the first embodiment or the ring oscillator circuit 182 of the second embodiment in place of the ring oscillator circuit 183. Even in this configuration, it is possible to implement a high-resolution A/D conversion circuit that stably operates as in the single-slope A/D conversion circuit 160 of the fourth embodiment or the integral A/D conversion circuit 161 of the fifth embodiment.

Sixth Embodiment

Next, a solid-stage imaging apparatus having a single-slope A/D conversion circuit will be described.

Figure 10:
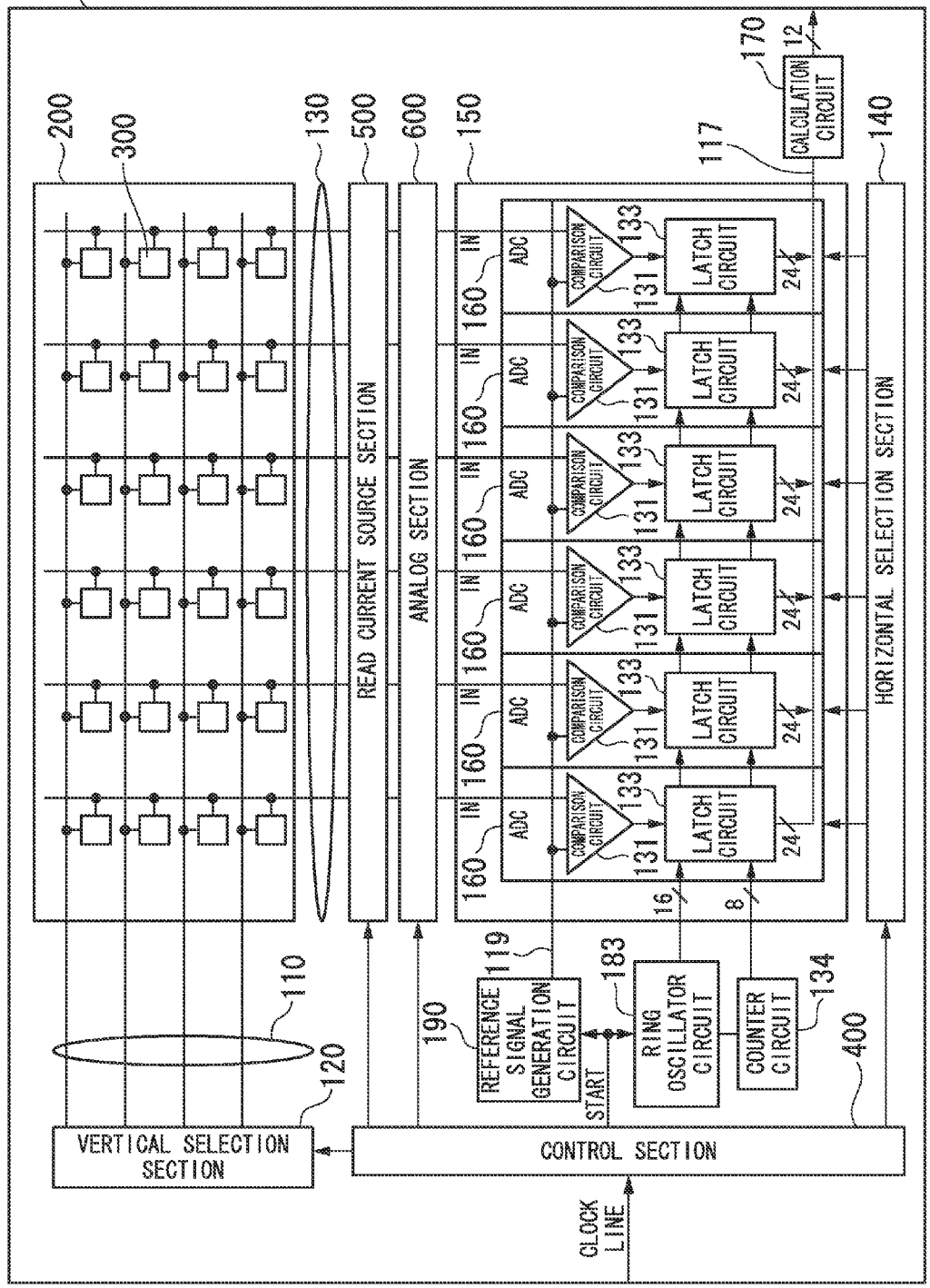
FIG. 10 is a block diagram illustrating a configuration of a solid-state imaging apparatus having a single-slope A/D conversion circuit according to a sixth embodiment of the present invention.

FIG. 10 is a block diagram illustrating a configuration of the solid-state imaging apparatus having the single-slope A/D conversion circuit according to this embodiment. In FIG. 10, the solid-state imaging apparatus 100 includes an imaging section 200, a vertical selection section 120, a read current source section 500, an analog section 600, a ring oscillator circuit 183, a reference signal generation circuit 190, a counter circuit 134, a column processing section 150, a horizontal selection section 140, a calculation circuit 170, and a control section 400.

The solid-state imaging apparatus 100 illustrated in FIG. 10 is an example in which a plurality of single-slope A/D conversion circuits 160, each of which is the same as that illustrated in FIG. 8, are provided in the solid-stage imaging apparatus 100. However, in the single-slope A/D conversion circuit 160 provided in the solid-state imaging apparatus 100, a plurality of pieces are not provided for each component of the A/D conversion circuit 160. There are provided only one ring oscillator circuit 183, one reference signal generation circuit 190, one counter circuit 134, and one calculation circuit 170 common to all the A/D conversion circuits 160. However, operations of components commonly provided in all the A/D conversion circuits 160 are the same as operations of corresponding components within the A/D conversion circuit 160. Thus, the same components as within the single-slope A/D conversion circuit 160 illustrated in FIG. 8 are denoted by the same reference numerals in the following description, and detailed description thereof is omitted. In order to facilitate the description, it will be described as the A/D conversion circuit 160.

In the imaging section 200, a plurality of unit pixels 300 are each arranged in a matrix to output a pixel signal according to a magnitude of an incident electromagnetic wave. In the solid-state imaging apparatus 100 illustrated in FIG. 10, the case in which the imaging section 200 includes the unit pixels 300 of 4 rows×6 columns is illustrated. Although not illustrated, the unit pixels 300 constituting the imaging section 200 include a photoelectric conversion element such as a photodiode/photogate/phototransistor and a transistor circuit.

The vertical selection section 120 selects each row of the imaging section 200. The read current source section 500 reads a signal from the imaging section 200 as a voltage signal. The analog section 600 performs analog processing of the signal read from the imaging section 200. The ring oscillator circuit 183, the counter circuit 134, and the reference signal generation circuit 190 correspond to the ring oscillator circuit 183, the counter circuit 134, and the reference signal generation circuit 190 within the single-slope A/D conversion circuit 160 illustrated in FIG. 8, respectively. The reference signal generation circuit 190 is connected to the column processing section 150 via a reference signal line 119. The horizontal selection section 140 reads data generated by the column processing section 150 to a horizontal signal line 117. The calculation circuit 170 is connected to the horizontal signal line 117. The control section 400 controls each part within the solid-state imaging apparatus 100.

In this system, a peripheral driving system or signal processing system, which controls driving of each unit pixel 300 of the imaging section 200, that is, peripheral circuits such as the vertical selection section 120, the horizontal selection section 140, the column processing section 150, the calculation circuit 170, the ring oscillator circuit 183, the reference signal generation circuit 190, the counter circuit 134, and the control section 400, is integrally formed with a semiconductor region such as single-crystal silicon using the same technology as semiconductor integrated circuit (IC) manufacturing technology along with the imaging section 200.

Here, each part within the solid-state imaging apparatus 100 will be described in further detail. In the imaging section 200, the unit pixels 300 are two-dimensionally arranged for 4 rows and 6 columns, and a row control line 110 is wired for each row with respect to a pixel array of 4 rows and 6 columns. One end of each row control line 110 is connected to an output end corresponding to a row of the vertical selection section 120. The vertical selection section 120 is constituted by a shift register, a decoder, or the like, and controls row addressing or row scanning of the imaging section 200 via the row control line 110 when each unit pixel 300 of the imaging section 200 is driven. In addition, a vertical signal line 130 is wired for each column with respect to the pixel array of the imaging section 200.

The read current source section 500 includes, for example, a negative-channel metal oxide semiconductor (NMOS) transistor. The vertical signal line 130 is connected from the imaging section 200 to a drain terminal. A desired voltage is appropriately applied to a control terminal. A source terminal is connected to GND. Thereby, a signal from a unit pixel 300 is output as a voltage mode. Although the case in which the NMOS transistor is used as a current source has been described above, the present invention is not limited thereto.

Detailed description of the analog section 600 is omitted. The analog section 600 processes a difference between a signal level (reset level) and a true signal level immediately after a pixel is reset for a pixel signal of a voltage mode input via the vertical signal line 130. Thereby, it is possible to eliminate a noise component such as fixed pattern noise (FPN), which is fixed variability for each pixel, or reset noise. An auto gain control (AGC) circuit having a signal amplification function may be provided if necessary.

The column processing section 150 has the A/D conversion section 160, for example, provided for each pixel column of the imaging section 200, that is, each vertical signal line 130. The column processing section 150 converts an analog pixel signal read from each unit pixel 300 of the imaging section 200 through the vertical signal line 130 for each pixel column into digital data. The A/D conversion circuit 160 includes a comparison circuit 131 and a latch circuit 133. The comparison circuit 131 and the latch circuit 133 correspond to the comparison circuit 131 and the latch circuit 133 within the single-slope A/D conversion circuit 160 illustrated in FIG. 8, respectively. Along with the reference signal generation circuit 190, the ring oscillator circuit 183, the counter circuit 134, and the calculation circuit 170, the column processing section 150 constitutes the same A/D conversion circuit as the single-slope A/D conversion circuit 160 illustrated in FIG. 8. Each A/D conversion circuit 160 within the column processing section 150 converts an analog pixel signal read from the unit pixel 300 of a selected pixel row of the imaging section 200 into digital pixel data.

The horizontal selection section 140 is constituted by a shift register, a decoder, or the like, and controls column addressing or column scanning of the A/D conversion circuit 160 of the column processing section 150. According to control of the horizontal selection section 140, digital data generated from AD conversion by the A/D conversion circuit 160 is sequentially read to the horizontal signal line 117. In FIG. 10, the case in which 24-bit parallel digital data is output from the latch circuit 133 is illustrated. However, the parallel digital data may be configured to be converted into serial data for an output.

The calculation section 170 corresponds to the calculation circuit 170 within the single-slope A/D conversion circuit 160 illustrated in FIG. 8. The calculation circuit 170 performs the same calculation process as the calculation circuit 170 within the single-slope A/D conversion circuit 160 illustrated in FIG. 8 for digital data input via the horizontal signal line 117. Digital data after calculation processing is output as digital data corresponding to a magnitude of an electromagnetic wave incident to the solid-state imaging apparatus 100. In addition to the same calculation process as in the calculation circuit 170 within the single-slope A/D conversion circuit 160 illustrated in FIG. 8, the calculation circuit 170 may further have embedded signal processing functions, for example, such as black level adjustment, column variability correction, color processing, and the like. The calculation circuit 170 may convert 12-bit parallel digital data into serial data and output the serial data.

The control section 400 includes a functional block of a timing generator (TG), which supplies predetermined timing pulse signals or clocks necessary for operations of parts such as the reference signal generation circuit 190, the ring oscillator circuit 183, the vertical selection section 120, the horizontal selection section 140, and the calculation circuit 170, and a functional block for communicating with the TG The control section 400 may be provided as a separate semiconductor IC independent of other functional elements such as the imaging section 200, the vertical selection section 120, and the horizontal selection section 140. In such a case, the same imaging apparatus as the solid-state imaging apparatus 100 according to this embodiment, which is an example of a semiconductor system, is constructed of an imaging device including the imaging section 200, the vertical selection section 120, and the horizontal selection section 140 and a control device including the control section 400. This imaging apparatus may be provided as an imaging module in which peripheral signal processing or a power supply circuit, or the like is also included.

Next, the operation of the solid-state imaging apparatus 100 will be described. Here, the description of a specific operation of the unit pixel 300 is omitted. As is well known, in the unit pixel 300, a reset level and a signal level are output. The output reset level and signal level are output as pixel output signals generated by a correlated double sampling (CDS) process from the analog section 600, and converted into 24-bit digital data by the column processing section 150.

Thereafter, according to control by the horizontal selection section 140, 24-bit digital data is sequentially output via the horizontal signal line 117 and transferred to the calculation circuit 170. The transferred 24-bit digital data is converted into a 12-bit binary number by the calculation circuit 170. Binary data corresponding to the pixel output signal is obtained.

The case in which a CDS process is performed by the analog section 600 in the solid-state imaging apparatus 100 according to this embodiment has been described. However, a configuration that performs the CDS process is not limited thereto. For example, a reset level including noise of a pixel signal is read from each unit pixel 300 of a selected row of the imaging section 200 in a first read operation and subjected to A/D conversion, a signal level is then read in a second read operation and subjected to A/D conversion, and the same process as the CDS process is then digitally performed, so that digital data corresponding to the pixel output signal may be configured to be obtained. In addition, the calculation section 170 may be embedded in the column processing section 150 without being limited to the above-described configuration.

As described above, the solid-state imaging apparatus 100 according to this embodiment can convert an analog pixel signal into digital data stably at a high speed by embedding the single-slope A/D conversion circuit 160 of the fourth embodiment. Thereby, it is possible to increase the speed of signal processing of a pixel output signal in the solid-state imaging apparatus 100. As a result, it is possible to implement high fineness and a high frame rate of the solid-state imaging apparatus 100.

Seventh Embodiment

Figure 11:
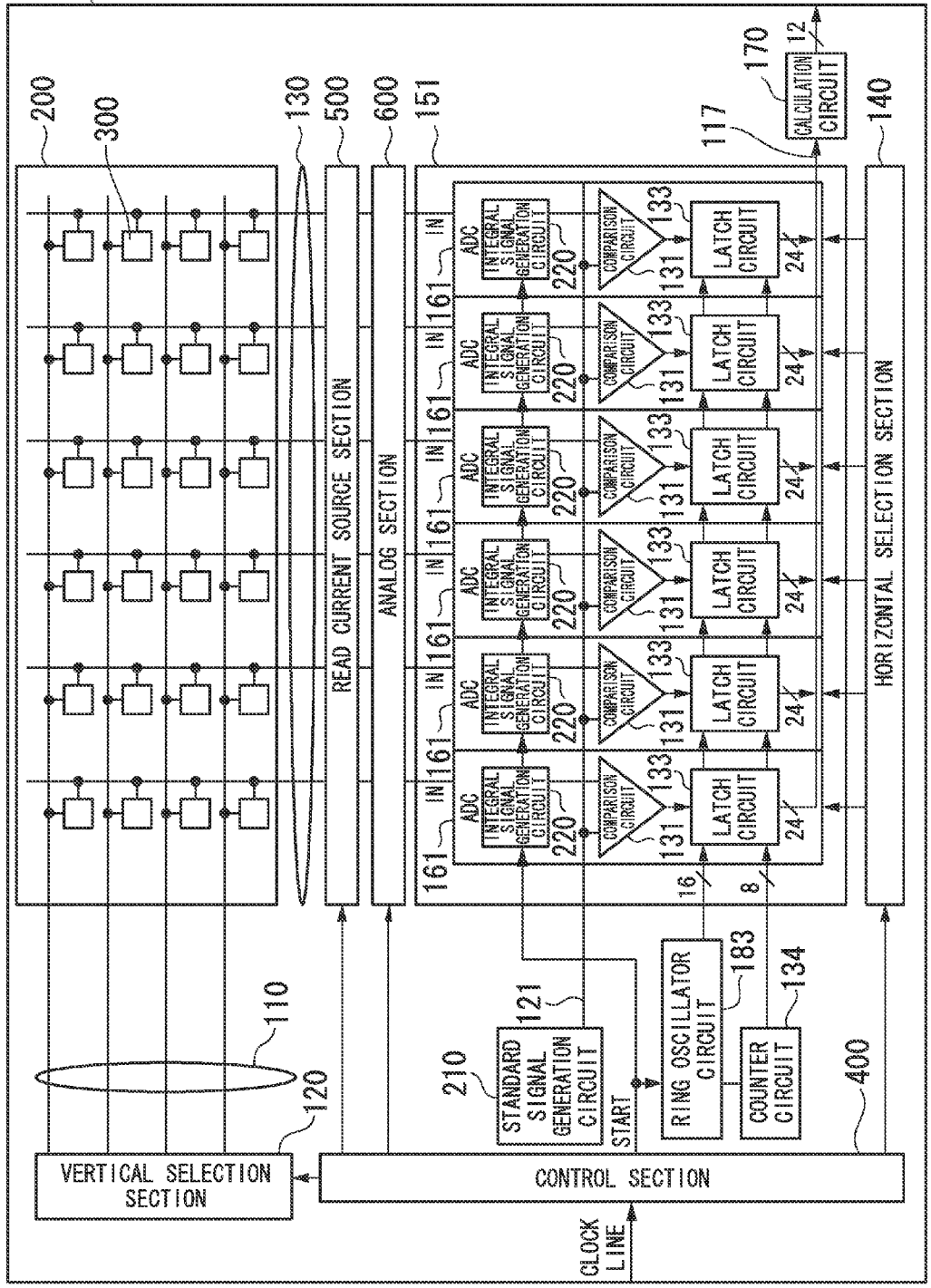
FIG. 11 is a block diagram illustrating a configuration of a solid-state imaging apparatus having an integral A/D conversion circuit according to a seventh embodiment of the present invention.

Next, the solid-state imaging apparatus having the integral A/D conversion circuit will be described. FIG. 11 is a block diagram illustrating a configuration of the solid-state imaging apparatus having the integral A/D conversion circuit according to this embodiment. In FIG. 11, the solid-state imaging apparatus 101 includes an imaging section 200, a vertical selection section 120, a read current source 500, an analog section 600, a ring oscillator circuit 183, a standard signal generation circuit 210, a counter circuit 134, a column processing section 151, a horizontal selection section 140, a calculation circuit 170, and a control section 400.

The solid-state imaging apparatus 101 illustrated in FIG. 11 is an example in which a plurality of integral A/D conversion circuits 161, each of which is the same as illustrated in FIG. 9, are provided in the solid-stage imaging apparatus 101. However, in the integral A/D conversion circuit 161 provided in the solid-state imaging apparatus 101, a plurality of pieces are not provided for each component of the A/D conversion circuit 161. There are provided only one ring oscillator circuit 183, one standard signal generation circuit 210, one counter circuit 134, and one calculation circuit 170 common to all the A/D conversion circuits 161. However, operations of components commonly provided in all the A/D conversion circuits 161 are the same as operations of corresponding components within the A/D conversion circuit 161. Thus, the same components as within the integral A/D conversion circuit 161 illustrated in FIG. 9 are denoted by the same reference numerals in the following description, and detailed description thereof is omitted. In order to facilitate the description, it will be described as the A/D conversion circuit 161.

Instead of the A/D conversion circuit 160 within the solid-state imaging apparatus 100 illustrated in FIG. 10, the solid-state imaging apparatus 101 includes the A/D conversion circuit 161. Accordingly, the same components as within the solid-state imaging apparatus 100 illustrated in FIG. 10 are denoted by the same reference numerals in the following description, and detailed description thereof is omitted.

Each standard signal generation circuit 210 corresponds to the standard signal generation circuit 210 within the integral A/D conversion circuit 161 illustrated in FIG. 9. The standard signal generation circuit 210 is connected to the column processing section 151 via a standard signal line 121. The horizontal selection section 140 reads data generated by the column processing section 151 to a horizontal signal line 117.

The column processing section 151 has the A/D conversion section 161, for example, provided for each pixel column of the imaging section 200, that is, each vertical signal line 130. The column processing section 151 converts an analog pixel signal read from each unit pixel 300 of the imaging section 200 through the vertical signal line 130 for each pixel column into digital data. The A/D conversion circuit 161 includes an integral signal generation circuit 220, a comparison circuit 131, and a latch circuit 133. The integral signal generation circuit 220, the comparison circuit 131, and the latch circuit 133 correspond to the integral signal generation circuit 220, the comparison circuit 131, and the latch circuit 133 within the integral A/D conversion circuit 161 illustrated in FIG. 9, respectively. Along with the standard signal generation circuit 210, the ring oscillator circuit 183, the counter circuit 134, and the calculation circuit 170, the column processing section 151 constitutes the same A/D conversion circuit as the integral A/D conversion circuit 161 illustrated in FIG. 9. Each A/D conversion circuit 161 within the column processing section 151 converts an analog pixel signal read from the unit pixel 300 of a selected pixel row of the imaging section 200 into digital pixel data.

The calculation section 170 corresponds to the calculation circuit 170 within the integral A/D conversion circuit 161 illustrated in FIG. 9. The calculation circuit 170 performs the same calculation process as the calculation circuit 170 within the integral A/D conversion circuit 161 illustrated in FIG. 9 for digital data input via the horizontal signal line 117. The calculation circuit 170 outputs digital data subjected to the calculation process as digital data corresponding to a magnitude of an electromagnetic wave incident to the solid-state imaging apparatus 101.

In the operation of the solid-state imaging apparatus 101, only the operation of the A/D conversion circuit 161 provided instead of the A/D conversion circuit 160 within the solid-state imaging apparatus 100 illustrated in FIG. 10 is different. In addition, the operation of the A/D conversion circuit 161 is the same as the operation of the integral A/D conversion circuit 161 described in the fifth embodiment. Accordingly, detailed description of the operation of the solid-state imaging apparatus 101 is omitted.

As described above, even in the solid-state imaging apparatus 101 according to this embodiment, the integral A/D conversion circuit 161 of the fifth embodiment is embedded, thereby converting an analog pixel signal into digital data stably at a high speed as in the solid-state imaging apparatus 100 having the single-slope A/D conversion circuit illustrated in FIG. 10. Thus, it is also possible to increase the speed of signal processing of a pixel output signal in the solid-state imaging apparatus 101. As a result, it is possible to implement high fineness and a high frame rate of the solid-state imaging apparatus 101.

As described above, the solid-state imaging apparatus has a built-in A/D conversion circuit to which the ring oscillator circuit 183 is applied, thereby increasing the speed of signal processing of a pixel output signal and implementing high fineness and a high frame rate of the solid-state imaging apparatus. The case in which the A/D conversion circuit to which the ring oscillator circuit 183 of the third embodiment is applied is embedded in the solid-state imaging apparatus 100 according to the above-described sixth embodiment and the solid-state imaging apparatus 101 according to the above-described seventh embodiment has been described. However, the ring oscillator circuit to be applied to the built-in A/D conversion circuit is not limited to the configuration illustrated in FIG. 10 or 11. For example, it is possible to apply the ring oscillator circuit 181 of the first embodiment or the ring oscillator circuit 182 of the second embodiment instead of the ring oscillator circuit 183. Even in this configuration, it is possible to implement high fineness and a high frame rate of the solid-state imaging apparatus like the solid-state imaging apparatus 100 according to the sixth embodiment and the solid-state imaging apparatus 101 according to this embodiment.

As described above, according to each embodiment, it is possible to cause the reset pulse (second reset pulse) to significantly precede the main pulse as compared to the ring oscillator circuit of the related art by configuring a ring oscillator circuit including a first starting inverting circuit, a second starting inverting circuit, and a third starting inverting circuit. Thereby, while a stable oscillation operation is secured, a ring oscillator circuit capable of accommodating the speed-up of the main pulse is obtained. A high-resolution A/D conversion circuit that stably operates by applying the ring oscillator circuit is obtained. In addition, this A/D conversion circuit is embedded so that a solid-state imaging apparatus having high fineness and a high frame rate is obtained.

Although an example of 4 rows and 6 columns has been described with respect to arrays of row and column directions of the unit pixels 300 within the imaging section 200, several tens to several tens of thousands of unit pixels 300 are actually arranged in each row or column of the imaging section 200. Accordingly, the arrays of the row and column directions of the unit pixels 300 to be arranged within the imaging section 200 are not limited to this embodiment. The number of the row and column directions in which unit pixels 300 are arranged can be changed without departing from the scope of the present invention.

In addition, the solid-state imaging apparatus in which A/D conversion circuits are arranged based on a one-to-one correspondence relationship for each column of the imaging section 200 has been described in this embodiment. However, the arrangement relationship of A/D conversion circuits within the solid-state imaging apparatus is not limited to this embodiment. For example, one A/D conversion circuit may be arranged for a plurality of columns of the imaging section 200, and one A/D conversion circuit may be used by time division among a plurality of pixels columns.

Although the embodiments have been described above with reference to the drawings, specific configurations are not limited to these embodiments, and modifications can also be made without departing from the scope of the present invention.

Accordingly, the invention is not to be considered as being limited by the foregoing description, and is only limited by the scope of the appended claims.

The invention claimed is:

1. A ring oscillator circuit in which an even number of inverting circuits, each of which inverts an input signal to output the inverted input signal, are connected in a ring and a pulse signal is caused to circulate around a circle of the inverting circuits connected in the ring,
   wherein one inverting circuit of the inverting circuits is a first starting inverting circuit, which starts driving of a first pulse signal according to an input control signal,
   another inverting circuit of the inverting circuits is a second starting inverting circuit, which starts driving of a second pulse signal based on a leading edge of the first pulse signal inverted by the one inverting circuit,
   still another inverting circuit of the inverting circuits is a third starting inverting circuit, which starts driving of a third pulse signal based on the leading edge of the first pulse signal inverted by the one inverting circuit after the driving of the second pulse signal is started by the second starting inverting circuit, and
   when there are simultaneously the first pulse signal, the second pulse signal, and the third pulse signal on the circle of the inverting circuits connected in the ring, the first starting inverting circuit, the second starting inverting circuit, and the third starting inverting circuit are each arranged within the circle connected in the ring so that a positional relationship of leading edges of the first, second, and third pulse signals is formed in order of the leading edge of the third pulse signal, the leading edge of the second pulse signal, and the leading edge of the first pulse signal in traveling directions of the pulse signals on the circle of the inverting circuits of the ring when the third pulse signal is a leading pulse signal.

2. The ring oscillator circuit according to claim 1,
wherein the even number of inverting circuits are connected in the ring in order of the first starting inverting circuit, inverting circuits of N (N≥0) stages connected to an output terminal of the first starting inverting circuit, inverting circuits of M (M≥0) stages connected to an output terminal of the inverting circuit of the Nth stage, the third starting inverting circuit connected to an output terminal of the inverting circuit of the Mth stage, inverting circuits of P (P≥0) stages connected to an output terminal of the third starting inverting circuit, inverting circuits of Q (Q≥0) stages connected to an output terminal of the inverting circuit of the $P^{th}$ stage, the second starting inverting circuit connected to an output terminal of the inverting circuit of the Qth stage, and inverting circuits of S (S≥0) stages connected to an output terminal of the second starting inverting circuit,
at least an output signal of the inverting circuit of the Sth stage among the inverting circuits of the S stages and the control signal are connected to input terminals of the first starting inverting circuit,
at least an output signal of the inverting circuit of the Mth stage among the inverting circuits of the M stages and an output signal of the inverting circuit of the $P^{th}$ stage among the inverting circuits of the P stages are connected to input terminals of the third starting inverting circuit,
at least an output signal of the inverting circuit of the Qth stage among the inverting circuits of the Q stages and an output signal of the inverting circuit of the Nth stage among the inverting circuits of the N stages are connected to input terminals of the second starting inverting circuit, and
the number of inverting circuits of the N and S stages is an odd number, and the number of inverting circuits of the P and the number of inverting circuits of the M and Q stages are even numbers.

3. The ring oscillator circuit according to claim 2,
wherein the first starting inverting circuit, the second starting inverting circuit, and the third starting inverting circuit each are negative AND (NAND) circuits or negative OR (NOR) circuits.

4. The ring oscillator circuit according to claim 3,
wherein the number of inverting circuits of the N stages is an odd number when both the first starting inverting circuit and the second starting inverting circuit are the NAND circuits or the NOR circuits, and
the number of inverting circuits of the N stages is an even number when the first starting inverting circuit is the NAND circuit and the second starting inverting circuit is the NOR circuit or when the first starting inverting circuit is the NOR circuit and the second starting inverting circuit is the NAND circuit.

5. The ring oscillator circuit according to claim 3,
wherein the number of inverting circuits of the N and M stages is an odd number when both the first starting inverting circuit and the third starting inverting circuit are the NAND circuits or the NOR circuits, and the number of inverting circuits of the N and M stages is an even number when the first starting inverting circuit is the NAND circuit and the third starting inverting circuit is the NOR circuit or when the first starting inverting circuit is the NOR circuit and the third starting inverting circuit is the NAND circuit.

6. The ring oscillator circuit according to claim 2, wherein the number of inverting circuits of (N+S+2) stages is greater than the number of inverting circuits of (M+P+Q+1) stages.

7. The ring oscillator circuit according to claim 3, wherein, in an array of all the inverting circuits connected in order of the first starting inverting circuit, the inverting circuits of the N stages, the inverting circuits of the M stages, the third starting inverting circuit, the inverting circuits of the P stages, the inverting circuits of the Q stages, the second starting inverting circuit, and the inverting circuits of the S stages,
an input threshold voltage of an odd-numbered inverting circuit is set to be low and an input threshold voltage of an even-numbered inverting circuit is set to be high when the first starting inverting circuit is the NAND circuit, and
the input threshold voltage of the odd-numbered inverting circuit is set to be high and the input threshold voltage of the even-numbered inverting circuit is set to be low when the first starting inverting circuit is the NOR circuit.

8. The ring oscillator circuit according to claim 1, further comprising:
a counter circuit for counting the number of circulations of the first pulse signal, which circulates around the circle of the inverting circuits connected in the ring, based on logical inversion of an output signal of one inverting circuit of the inverting circuits connected in the ring.

9. The ring oscillator circuit according to claim 3, further comprising:
a counter circuit for detecting an edge of an output signal when the output signal of the inverting circuit of the Sth stage among the inverting circuits of the S stages is logically inverted, and counting the number of circulations of the first pulse signal, which circulates around the circle of the inverting circuits connected in the ring, based on the detected edge,
wherein the counter circuit counts the number of circulations of the first pulse signal based on an edge when the output signal is logically inverted from a "Low" level to a "High" level when the first starting inverting circuit is the NAND circuit, and
the counter circuit counts the number of circulations of the first pulse signal based on an edge when the output signal is logically inverted from the "High" level to the "Low" level when the first starting inverting circuit is the NOR circuit.

10. The ring oscillator circuit according to claim 8, further comprising:
a latch circuit for latching one or both of output signals of all or some inverting circuits connected in the ring and a signal indicating the number of circulations of the first pulse signal counted by the counter circuit.

11. The ring oscillator circuit according to claim 10, further comprising:
a comparison circuit for comparing an input predetermined analog signal to a reference signal that increases or decreases along with the passage of time, and outputting a comparison signal when the reference signal satisfies a predetermined condition for the analog signal,
wherein the pulse signal is caused to circulate around the circle of the inverting circuits connected in the ring by inverting a logical of the control signal based on a timing at which the reference signal is input to the comparison circuit, and
the latch circuit latches the signal based on a timing at which the comparison signal is output from the comparison circuit.

12. The ring oscillator circuit according to claim 10, further comprising:
a comparison circuit for comparing a predetermined standard signal to an integral signal that increases or decreases along with the passage of time according to a magnitude of an input predetermined analog signal, and outputting a comparison signal when the integral signal satisfies a predetermined condition for the standard signal,
wherein the pulse signal is caused to circulate around the circle of the inverting circuits connected in the ring by inverting logic of the control signal based on a timing at which the integral signal is input to the comparison circuit, and
the latch circuit latches the signal based on a timing at which the comparison signal is output from the comparison circuit.

13. An analog to digital (A/D) conversion circuit comprising:
the ring oscillator circuit according to claim 11;
a reference signal generation circuit for generating the reference signal; and
a calculation circuit for generating a digital signal corresponding to the analog signal based on the signal latched by the latch circuit.

14. An A/D conversion circuit comprising:
the ring oscillator circuit according to claim 12;
an integral signal generation circuit for generating the integral signal;
a standard signal generation circuit for generating the standard signal; and
a calculation circuit for generating a digital signal corresponding to the analog signal based on the signal latched by the latch circuit.

15. A solid-state imaging apparatus comprising:
an imaging section in which a plurality of pixels, each of which outputs a pixel signal corresponding to a magnitude of an incident electromagnetic wave, are arranged in a two-dimensional matrix; and
the A/D conversion circuit according to claim 13 to which the analog signal corresponding to the pixel signal is input,
wherein the comparison circuit and the latch circuit are provided for every one or more columns of the pixels constituting the imaging section.

16. A solid-state imaging apparatus comprising:
an imaging section in which a plurality of pixels, each of which outputs a pixel signal corresponding to a magnitude of an incident electromagnetic wave, are arranged in a two-dimensional matrix; and
the A/D conversion circuit according to claim 14 to which the analog signal corresponding to the pixel signal is input,
wherein the integral signal generation circuit, the comparison circuit, and the latch circuit are provided for every one or more columns of the pixels constituting the imaging section.

* * * * *